(12) United States Patent
Toyota

(10) Patent No.: US 6,289,077 B1
(45) Date of Patent: *Sep. 11, 2001

(54) TRANSMISSION SYSTEM FOR SYNCHROTRON RADIATION LIGHT

(75) Inventor: Eijiro Toyota, Tokyo (JP)

(73) Assignee: Sumitomo Heavy Industries, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/569,200

(22) Filed: May 11, 2000

Related U.S. Application Data

(62) Division of application No. 09/071,474, filed on May 1, 1998.

(30) Foreign Application Priority Data

| May 6, 1997 | (JP) | 9-115871 |
| May 6, 1997 | (JP) | 9-115872 |
| Feb. 26, 1998 | (JP) | 10-45506 |

(51) Int. Cl.$^7$ .................................................. G01K 5/00
(52) U.S. Cl. ............................................. 378/34; 378/161
(58) Field of Search ............................. 378/34, 84, 161, 378/140, 156, 159

(56) References Cited

U.S. PATENT DOCUMENTS

| 4,831,640 | 5/1989 | Buckley . |
| 5,204,886 | 4/1993 | Dugdale . |
| 5,335,259 | * 8/1994 | Hayashida et al. .................. 378/161 |
| 5,524,042 | * 6/1996 | Kovacs .............................. 378/161 |

FOREIGN PATENT DOCUMENTS

| 0 083 394 A2 | 7/1983 | (EP) . |
| 0 311 058 A2 | 4/1989 | (EP) . |
| 0 387 038 A2 | 9/1990 | (EP) . |
| 61-242022 | 10/1986 | (JP) . |
| 63-172425 | 7/1988 | (JP) . |
| 63-236321 | 10/1988 | (JP) . |
| 03-108699 | 5/1991 | (JP) . |
| 03-155116 | 7/1991 | (JP) . |
| 04-113299 | 4/1992 | (JP) . |
| 04-297013 | 10/1992 | (JP) . |
| 06-5200 | 1/1994 | (JP) . |
| 06-68999 | 3/1994 | (JP) . |
| 63-235321 | 10/1998 | (JP) . |

OTHER PUBLICATIONS

Patent Abstracts of Japan, vol. 011, No. 088 (E–490), Mar. 18, 1987 (Mar. 18, 1987) and JP 61–242022 A (Hitachi Ltd.), Oct. 28, 1986 (Oct. 28, 1986), Abstract; figures.

(List continued on next page.)

*Primary Examiner*—David P. Porta
(74) *Attorney, Agent, or Firm*—Frishauf, Holtz, Goodman, Langer & Chick, P.C.

(57) ABSTRACT

In a synchrotron radiation light transmission system, a mirror is disposed in a mirror box for reflecting synchrotron radiation light, the mirror box being formed with an incoming opening and an outgoing opening through which the synchrotron radiation light having a horizontally elongated cross section passes. A swinging mechanism supports the mirror so as to allow the synchrotron radiation light entered the mirror box via the incoming opening to be reflected by the mirror and to change a travelling direction in a vertical plane and for swinging the mirror to change a change angle of the travelling direction. The swing axis is on a cross line, or on its extension, between an incidence plane of the synchrotron radiation light and a tangential plane of the mirror at a reflection point and also on an incidence side of the synchrotron radiation light from the reflection point. The swinging mechanism swings the mirror so that the reflection point of the synchrotron radiation light moves on a reflection plane of the mirror as the mirror swings, and that an incidence angle becomes larger as a distance between a light source of the synchrotron radiation light and the reflection point becomes longer.

7 Claims, 23 Drawing Sheets

OTHER PUBLICATIONS

Patent Abstracts of Japan, vol. 017, No. 115 (E–1330), Mar. 10, 1993 (Mar. 10, 1993) and JP 04–297013 A (Canon Inc.), Oct 21, 1992 (Oct. 21, 1992), Abstract, figures.

Patent Abstracts of Japan, vol. 012, No. 440 (E–684), Nov. 18, 1988 (Nov. 18, 1988) and JP 63–172425 A (Sanyo Electric Co., Ltd.) Jul. 16, 1988 (Jul. 16, 1988), Abstract, figures.

R. Haelbich et al, J. Vac. Sci. Technol. B1 (4), 1983, pp. 1262–1263, American Vacuum Society.

H. Kuroda et al J. Vac. Sci., Technol. B9 (6), 1991, pp. 3218–3221, American Vacuum Society.

D.C. Li et al, J. Sci. & Industrial Research, vol. 53, 1994, pp. 747–751.

Patent Abstracts of Japan, vol. 011, No. 088 (E–490), Mar. 18, 1987 (Mar. 18, 1987) and JP 61–242022 A (Hitachi Ltd.), Oct 28, 1986 (Oct. 28, 1986). Abstract; figures.

Patent Abstracts of Japan, vol. 017, No. 115 (E–1330), Mar. 10, 1993 (Mar. 10, 1993) and JP 04–297013 A (Canon Inc.), Oct. 21, 1992 (Oct 10, 1992), Abstract; figures.

* cited by examiner

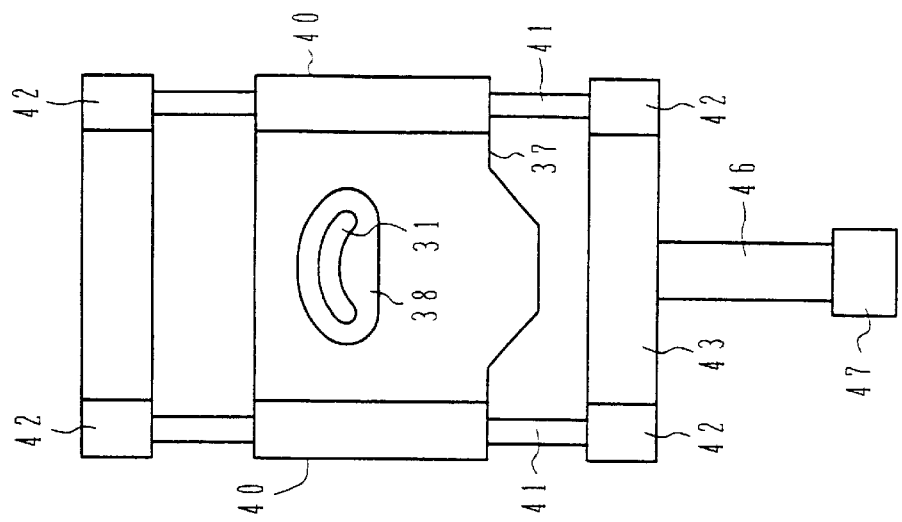
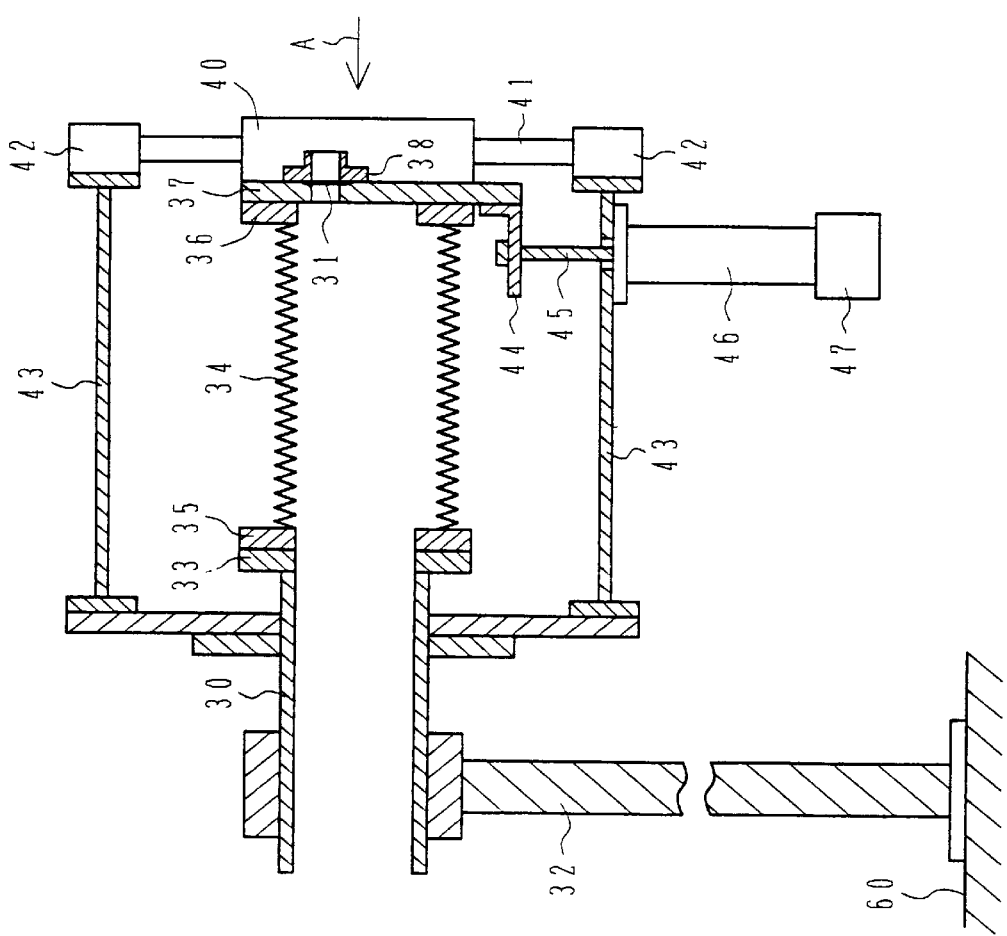

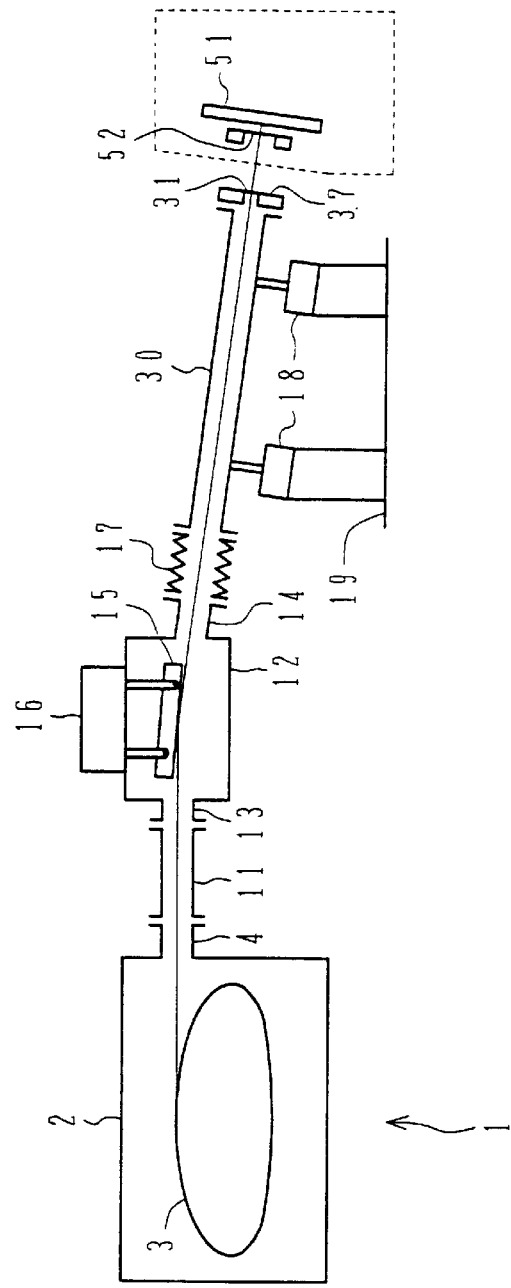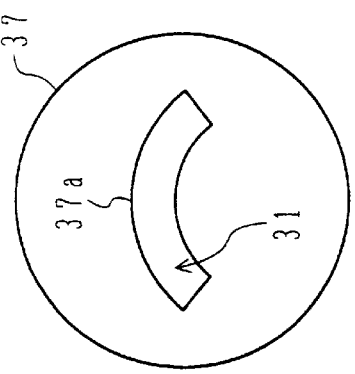

US 6,289,077 B1

TRANSMISSION SYSTEM FOR SYNCHROTRON RADIATION LIGHT

This is a division of application Ser. No. 09/071,474 filed May 1, 1998.

This application is based on Japanese Patent Applications No. HEI-9-115871 and No. HEI-9-115872 both filed on May 6, 1997 and No. HEI-10-45506 filed on Feb. 26, 1998, the entire contents of which are incorporated herein by reference.

BACKGROUND OF THE INVENTION a) Field of the Invention

The present invention relates to a transmission system for synchrotron radiation light (SR light), and more particularly to an SR light transmission system capable of giving an intensity distribution to SR light in a cross sectional plane perpendicular to its optical axis and to an SR light transmission system irradiating a certain area by swinging up and down the transporting direction of the SR light using a swinging mirror.

b) Description of the Related Art

With reference to FIG. 1, the structure of a conventional X-ray exposure system will be described. Reference to FIG. 1 is also made when embodiments of the invention are described later.

The X-ray exposure system is constituted of an SR light generator unit 1, an SR light transmission unit 10 and an X-ray stepper 50.

The SR light generator unit 1 is constituted of a vacuum room 2 and an electron beam circular orbit 3 formed therein. SR light is radiated from electrons moving along the circular orbit 3. This SR light is output from a beam output port of the vacuum room 2.

The SR light transmission unit 10 has an incoming vacuum duct 11, a mirror box 12 and an outgoing vacuum duct 30. Incoming opening 13 and outgoing opening 14 are formed in the wall of the mirror box 12. The incoming vacuum duct 11 hermetically communicates the beam output port of the SR light generator unit 1 with the incoming opening 13. In the vacuum duct 11, a vacuum shielding valve (not shown), an SR light shielding shutter (not shown) and the like are mounted. The input port of the outgoing vacuum duct 30 is hermetically coupled to the outgoing opening 14.

A reflection mirror 15 is disposed in the mirror box 12 and supported by a mirror swinging mechanism 16. SR light entered the mirror box 12 via the incoming opening 13 is reflected by the mirror 15 and enters the outgoing vacuum duct 130 via the outgoing opening 14. The mirror 15 is disposed such that its incidence plane containing an optical center axis of incidence SR light and a normal to a reflection plane at the reflection point and such that an angle between the optical center axis and the reflection plane is about 1 to 2°, i.e., the incidence angle is about 89 to 88°.

The swinging mechanism 16 swings the mirror 15 by using an axis, vertical to the incidence plane and passing the reflection point of SR light, i.e., a horizontal rotary shaft as a swing axis. As the mirror 15 swings, reflected SR light is swung up and down. The swing axis may be set to a position different from the reflection point of SR light.

An output window made of a beryllium thin film is formed in a window flange 37 which is hermetically mounted on an output end of the outgoing vacuum duct 30. SR light entered the outgoing vacuum duct 30 transmits through the output window formed in the window flange 37 and is radiated to the outside of the vacuum duct 30. An X-ray stepper 50 is disposed facing the window flange 37. The X-ray stepper 50 holds a semiconductor substrate 51 at the position where SR light radiated from the window flange 37 is applied. An exposure mask 52 is supported in front of the semiconductor substrate 51.

Although SR light is irradiated omnidirectionally in the horizontal plane, it has only a spread of about +/−1 mrad (mili-radian) in the vertical plane. By swinging the mirror 15, SR light is swung in the vertical direction so that SR light can be applied to a broad surface area of the semiconductor substrate 51.

SR light diverges in the horizontal direction. This SR light is therefore converged in the horizontal direction to make it parallel light fluxes, so that a use efficiency of SR light radiated from the light source can be improved. If the intensity of X-ray is increased, the X-ray exposure time can be shortened.

In order to converge SR light in the horizontal direction, as the mirror 15 shown in FIG. 1, a cylindrical mirror or a troidal mirror is used. A substantial focal length of a cylindrical mirror or troidal mirror changes with an incidence angle of SR light. As the mirror 15 is swung, the incident angle changes and the focal length with respect to the horizontal plane changes with the incidence angle correspondingly.

As the focal length changes, an energy density of SR light on the surface of the semiconductor substrate 51 changes. It is therefore difficult to uniformly apply X-rays to the surface of the semiconductor substrate 51.

SR light reflected by a cylindrical mirror or a troidal mirror has a shape extending along generally a circular line in the cross sectional plane (beam cross section) perpendicular to the optical axis. Therefore, an SR light radiation area on the exposure surface of the semiconductor substrate 51 has also a shape extending along generally a circular line. SR light can be applied to a broad area by moving this radiation area in the radial direction passing through a center point of the circular line.

A length of the circular radiation area cut along a straight line parallel to the motion direction of the area becomes longer at the position remoter from the center of the radiation area in the horizontal direction. The exposure amount on the exposure plane obtained by swinging the mirror and moving such an exposure area in the vertical direction on the exposure plane, becomes larger at the position remoter from the center of the exposed area. It is therefore difficult to uniformly expose the exposure plane by using SR light having the circular radiation area.

SUMMARY OF THE INVENTION

It is an object of the present invention to provide an SR light transmission system capable of improving an exposure performance of an exposure apparatus using SR light.

It is another object of the present invention to provide a synchrotron radiation light transmission system capable of making a distribution of exposure amounts in an exposure area nearly uniform.

According to one aspect of the present invention, there is provided a synchrotron radiation light transmission system, comprising: a mirror box formed with an incoming opening and an outgoing opening through which synchrotron radiation light having a horizontally elongated cross section passes; a mirror disposed in the mirror box for reflecting the synchrotron radiation light; and a swinging mechanism for supporting the mirror so as to allow the synchrotron radiation light entered the mirror box via the incoming opening to be reflected by the mirror and to change a travelling direction in a vertical plane and for swinging the mirror to change a change angle of the travelling direction, wherein a swing axis is on a cross line, or on its extension, between an incidence plane of the synchrotron radiation light and a tangential plane of the mirror at a reflection point and also on an incidence side of the synchrotron radiation light from the reflection point, the reflection point of the synchrotron radiation light moves on a reflection plane of the mirror as the mirror swings, and the mirror is swung so that an incidence angle becomes larger as a distance between a light source of the synchrotron radiation light and the reflection point becomes longer.

If the mirror is a cylindrical surface mirror, a troidal mirror, a conical surface mirror or the like, a focal length in the horizontal plane changes with an incidence angle of synchrotron radiation light. A change in the focal length is compensated by changing the position of the reflection point to thereby form suitable reflected SR light.

According to another aspect of the present invention, there is provided a synchrotron radiation light transmission system, comprising: a mirror box formed with an incoming opening and an outgoing opening through which synchrotron radiation light having a horizontally elongated cross section passes; a light source for making the synchrotron radiation light incident upon the incoming opening of the mirror box; a mirror disposed in the mirror box for reflecting the synchrotron radiation light; and a swinging mechanism for supporting the mirror so as to allow the synchrotron radiation light entered the mirror box via the incoming opening to be reflected by the mirror and to change a travelling direction in a vertical plane and for swinging the mirror to change a change angle of the travelling direction, wherein a reflection point on the mirror of the synchrotron radiation light moves on a reflection plane of the mirror as the mirror swings, the mirror is swung so that an incidence angle becomes larger as a distance between a light source of the synchrotron radiation light and the reflection point becomes longer, and a distance between the reflection point of the synchrotron radiation light and a swing axis of the mirror is not shorter than a distance between the reflection point and the light source.

As the swing radius is set longer than the distance between the reflection point and light source, the energy density of synchrotron radiation light on the exposure plane can be made more uniform.

According to another aspect of the present invention, there is provided a synchrotron radiation light transmission system comprising: an optical system for transmitting synchrotron radiation light; and a thin film disposed in an optical path of the synchrotron radiation light, made of material capable attenuating the synchrotron radiation light, and formed so that an optical path length in the thin film of the synchrotron radiation light transmitting through the thin film is not uniform in an in-plane of the thin film.

Since the optical path length in the thin film of synchrotron radiation light is different at each point in the in-plane of the thin film, the synchrotron radiation light can be attenuated by different amounts at respective points in the in-plane of the thin film.

According to a further aspect of the present invention, there is provided a synchrotron radiation light transmission system, comprising: a mirror box formed with an incoming opening and an outgoing opening through which synchrotron radiation light having a horizontally elongated beam cross section passes; a mirror disposed in the mirror box for reflecting the synchrotron radiation light; a duct coupled to the outgoing opening of the mirror box for defining a hollow space through which the synchrotron radiation light output from the outgoing opening passes; and a thin film mounted at an output port of the duct for attenuating and transmitting the synchrotron radiation light, wherein an optical path length in the thin film of the synchrotron radiation light transmitting through the thin film is made different in each point in an in-plane of the thin film to change an attenuation amount of the synchrotron radiation light in the in-plane.

Since the transmission optical path length of the thin film is different at each point, the attenuation amount of synchrotron radiation light also become different. By controlling the transmission optical path length distribution, a desired intensity distribution of the synchrotron radiation light transmitted through the thin film can be obtained.

As above, an attenuation amount distribution of SR light can be provided in a plane perpendicular to the optical axis. If the invention is applied to X-ray exposure using SR light, uniform exposure is possible by attenuating SR light so as to compensate for a variation of SR light intensities in the beam cross section.

BRIEF DESCRIPTION OF THE DRAWINGS

FIGS. 5A and 5B are a cross sectional view and a side view showing an area near the SR light output port of the X-ray exposure system shown in FIG. 1.

FIG. 11A is a schematic diagram showing an X-ray exposure system according to another embodiment of the invention, and FIG. 11B is a front view of a window flange.

DETAILED DESCRIPTION OF THE PREFERRED EMBODIMENTS

Figure 1:
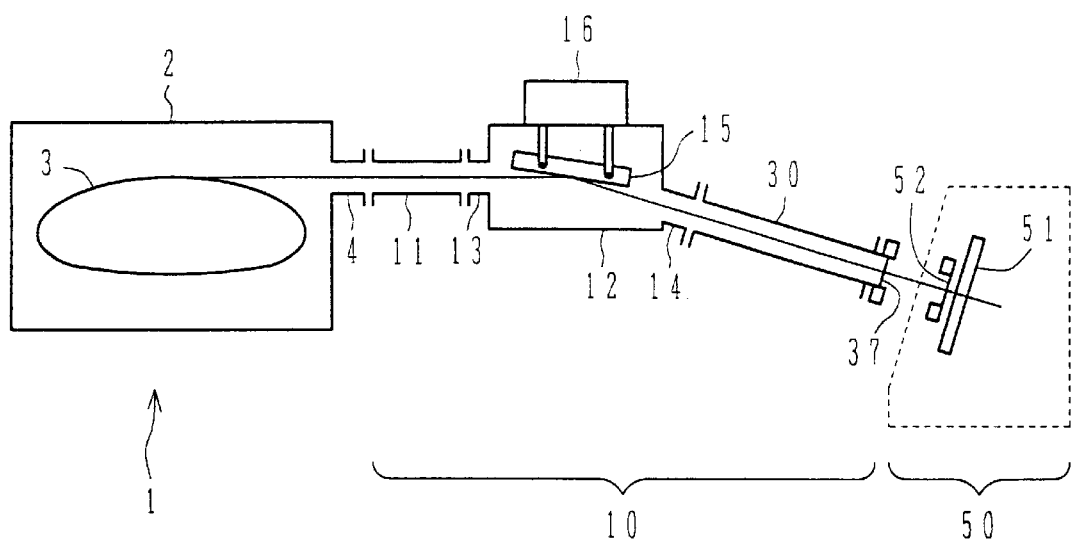
FIG. 1 is a schematic diagram showing an X-ray exposure system according to an embodiment of the present invention.

FIG. 1 is a schematic diagram showing an X-ray exposure system assembled with an SR light transmission system according to an embodiment of the invention. The outline of the X-ray exposure system has been described already, and so the description thereof is not duplicated herein. In the SR light transmission system of this embodiment, the structures of the mirror 15, swinging mechanism 16 and window flange 37 are different from those of conventional systems. These different structures will be later detailed. First, a change in a substantial focal length when the mirror 15 swings will be discussed.

Figure 2:
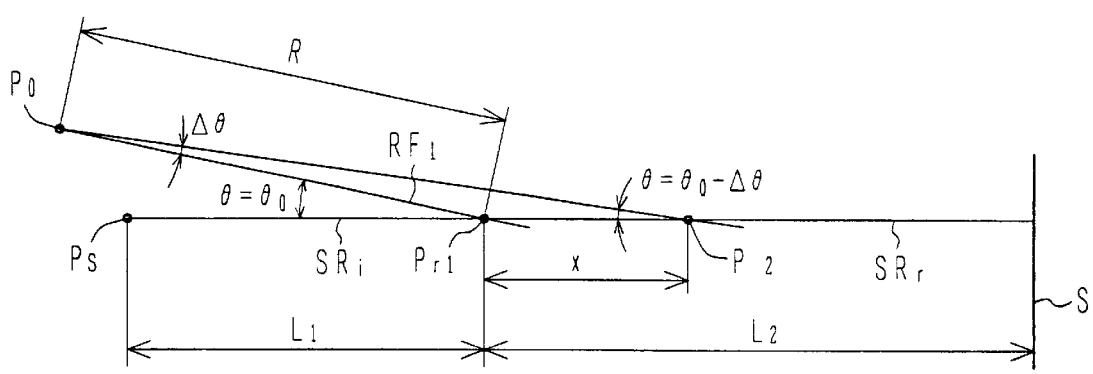
FIG. 2 is a line diagram illustrating a relation between an optical axis of SR light and a reflection plane of a mirror, respectively of the X-ray exposure system shown in FIG. 1.

FIG. 2 is a schematic diagram showing a relation between the optical axis of SR light and the reflection plane of the mirror 15. When the mirror is set at a reference position, SR light $SR_1$ radiated from a light source $P_s$ is incident upon a reference reflection point $P_{r1}$ on the reflection plane of the mirror. Light $SR_r$ reflected at the reference reflection point $P_{r1}$ is applied to an exposure plane S of a semiconductor substrate. A swing axis $P_o$ is on a line extending from the reflection plane $RF_1$ of the mirror at the reference position.

$L_1$ is defined as a distance between the light source $P_s$ and the reference reflection point $P_{r1}$, $L_2$ is defined as a distance between the reference reflection point $P_{r1}$ and the exposure plane S. R is defined as a distance between the reference reflection point $P_{r1}$ and the swing axis $P_o$, and θ is defined as an angle between the mirror reflection plane and the optical axis of the incidence light $SR_1$. It is assumed that the mirror reflection plane is a curved plane symmetrical with a rotation center axis in the incidence plane.

Consider now that the mirror swings by an angle Δθ from the reference position. Representing the reflection point at this time as $P_{r2}$, a distance x between the reference reflection point $P_{r1}$ and the reflection point $P_{r2}$ is given by:

$$x = R \times \sin(\Delta\theta)/\sin(\theta_o - \Delta\theta) \approx R \times \sin(\Delta\theta)/(\sin(\theta_o) - \sin(\Delta\theta)) \quad (1)$$

The conditions that the SR light $SR_1$ radiated from the light source $P_s$ and reflected by the mirror becomes parallel light fluxes, are given by:

$$f = L_1 + x \quad (2)$$

where f is a focal length of the mirror.

A fundamental equation of the mirror satisfies:

$$f = r/(2 \sin(\theta_o - \Delta\theta)) \quad (3)$$

where r is a radius of curvature of the reflection plane at the reflection point $P_{r2}$. By erasing Δθ from the equations (1) to (3), r is expressed as a function of x as:

$$r = ((L_1+x)/(R+x)) \cdot 2R \sin(\theta_o) = (1-(1-L_1/R)/(1+x/R)) \cdot 2R \sin(\theta_o) \quad (4)$$

If x/R<<1, the equation (4) is rewritten as:

$$r \approx (1-(1-L_1/R) \cdot (1-x/R)) \cdot 2R \sin(\theta_o) \quad (5)$$

Namely, the radius r of curvature can be approximated by a linear function of x. This indicates that the mirror reflection plane has nearly a conical surface.

If the mirror reflection plane has a conical surface having the radius r of curvature given by the equation (5), the shape of light reflected from the mirror at any swing angle and vertically projected upon the horizontal plane is always that of parallel light fluxes.

If $R = L_1$ is substituted into the equation (5), then it is represented by:

$$r \approx 2L_1 \sin(\theta_o) \quad (6)$$

Therefore, the radius r of curvature is constant at any value x. This means that the mirror reflection plane has a cylindrical surface.

Therefore, if the swing radius R is equal to the distance $L_1$ between the reflection reference point $P_{r1}$ and the light source $P_s$ and the mirror reflection plane is made to have a cylindrical surface having the radius of curvature given by the equation (6), then it is possible to make the shape of light reflected from the mirror and vertically projected upon the horizontal plane have that of parallel light fluxes.

Next, the results of simulation made to verify the effects of the mirror 15 having a cylindrical surface will be described with reference to FIGS. 3A to 3C.

Figure 3C:
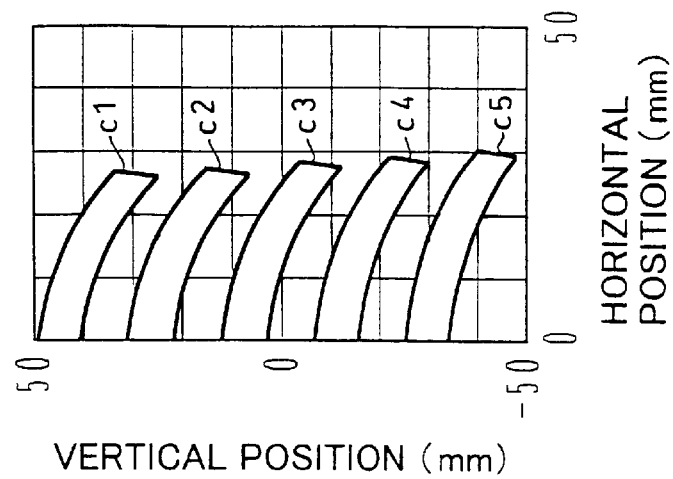
FIGS. 3A to 3C are diagrams showing the shapes of SR light radiation areas on an exposure surface.
Figure 3B:
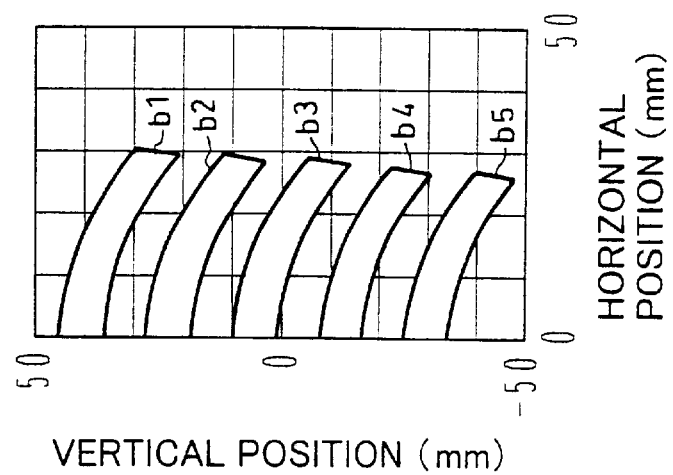
Figure 3A:
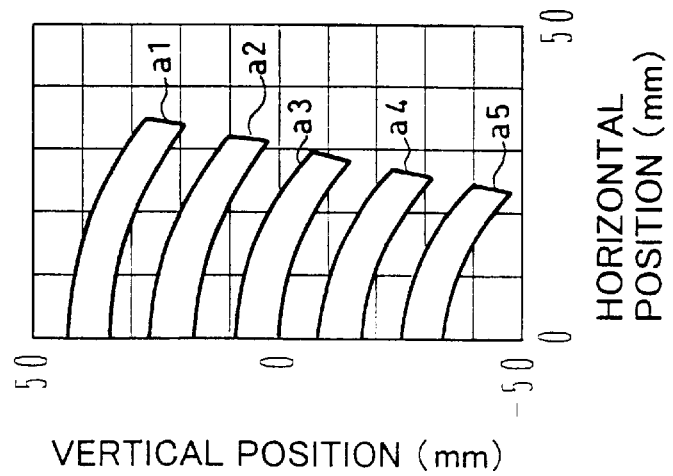

FIGS. 3A to 3C show the shapes of SR light exposure areas on the exposure plane. The abscissa corresponds to the horizontal direction, and the ordinate corresponds to the direction along which the optical axis of reflected SR light extends. Only one side of the shape of a radiation area is shown in FIGS. 3A to 3C, the whole shape being symmetrical with right and left. The spread angle of SR light radiated from the light source was set to +/−10 mrad in the horizontal direction, to +/−0.5 mrad in the vertical direction, and an angle $\theta_o$ between the incidence light optical axis and the reflection plane at the mirror reference position was set to 1.8°. The distances $L_1$ and $L_2$ shown in FIG. 2 were set to 3 m and 6 m, respectively.

In the case of FIG. 3A, the swing radius R was set to 0, i.e., the mirror was swung around the reference reflection point $P_{r1}$. Shapes $a_1$ to $a_5$ show the radiation areas of SR light when the angle θ shown in FIG. 2 was varied. The shape $a_1$ corresponds to the radiation area at the angle θ of 1.61°, and the shape $a_5$ corresponds to the radiation area at the angle θ of 1.94°. The shapes $a_2$ to $a_4$ correspond to the angles between 1.61° and 1.94°. As the angle θ becomes small, the radiation area moves upward and the expansion in the horizontal direction becomes large. This means that the focal length f given by the equation (2) becomes long and the convergence force of the cylindrical mirror weakens.

In the case of FIG. 3B, the swing radius R was set to 3 m, i.e., $R=L_1$. A shape $b_1$ corresponds to the radiation area at the angle θ of 1.67°. and the shape $b_5$ corresponds to the radiation area at the angle θ of 1.89°. The shapes $b_2$ to $b_4$ correspond to the angles between 1.67° and 1.89°. The case of FIG. 3B satisfies the conditions of the equation (6) so that reflected SR light becomes parallel light fluxes. Therefore, a variation of the sizes of radiation areas when the angle θ is varied, is small.

In the case of FIG. 3C, the swing radius R was set to 10 m. A shape $c_1$ corresponds to the radiation area at the angle θ of 1.72°, and the shape $c_5$ corresponds to the radiation area at the angle θ of 1.89°. The shapes $c_2$ to $c_4$ correspond to the angles between 1.72° and 1.89°. In the case of FIG. 3C, as the angle θ is made small, the lateral width of the radiation area becomes narrow. This is because the influence of an elongated focal length by the smaller angle θ is less than the influence of a shortened distance ($L_2-x$) between the reflection point $P_{r2}$ and the exposure plane S shown in FIG. 2. The shapes of radiation areas at the swing radius $R=L_1$ are not uniform, the reason of which is that light shifted from the optical axis was not compensated in fundamental calculations of simulation.

Comparison between FIGS. 3A and 3C shows that the change in the area and shape of a radiation area is smaller in FIG. 3C than in FIG. 3A. Namely, in order to make the energy density on the exposure plane uniform, it is preferable to set the swing radius R larger than the distance $L_1$ between the light source $P_s$ and the reference reflection point $P_{r1}$.

Next, examples of the structure of the swinging mechanism shown in FIG. 1 will be described with reference to FIGS. 4A to 4C.

Figure 4A:
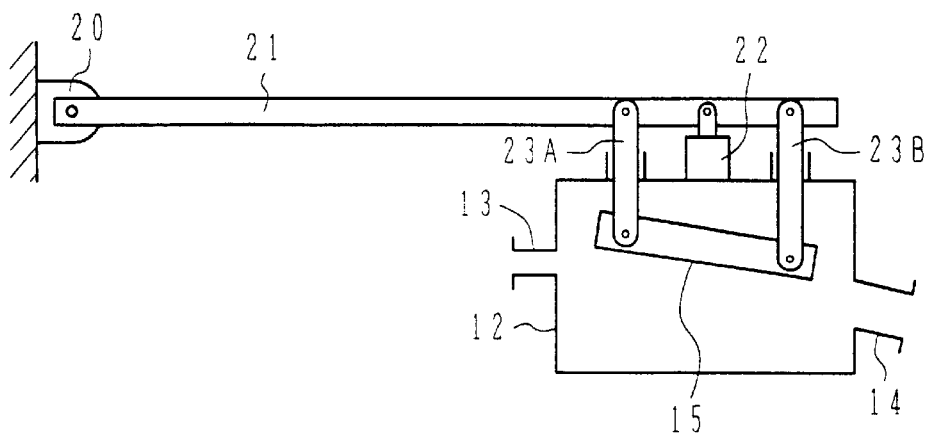
FIGS. 4A to 4C are front views briefly showing examples of the structure of a swinging mechanism of the X-ray exposure system shown in FIG. 1.

FIG. 4A shows a first example of the swinging mechanism. One end of a lever 21 is pivotally supported by a support shaft 20 whose relative position to the mirror box 12 is fixed. A drive point of a drive mechanism 22 mounted on the mirror box 12 couples to the level 21 near at its other end.

The mirror 15 is supported in the mirror box by two links 23A and 23B. Portions of the links 23A and 23B extend out of the mirror box 12 and fixed to the lever 21 near at its other end portions. The regions via which the links 23A and 23B pass through the wall of the mirror box 12 are maintained to be hermetically sealed with bellows to maintain vacuum. A relative position of the mirror 15 to the support shaft 20 is set so that a straight line extending from the reflection plane of the mirror 15 toward the incoming opening 13 intersects with the support shaft 20.

As the driving mechanism 22 moves up and down the drive point, the lever 21 swings around the support shaft 20 so that the mirror 15 coupled thereto also swings around the support shaft 20.

Figure 4B:
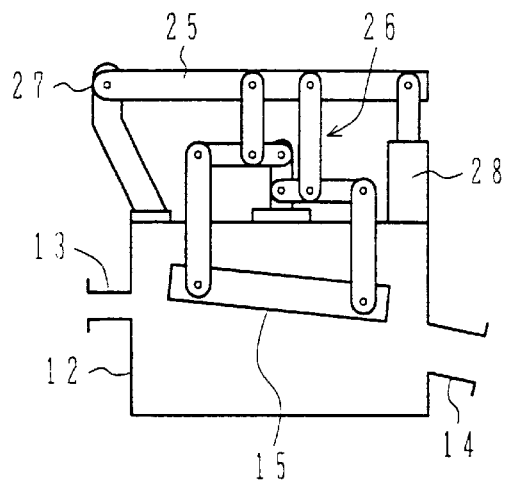

FIG. 4B shows a second example of the swinging mechanism. In the case of FIG. 4A, the mirror 15 is fixed to the swinging lever 21 near at its end portions. In contrast, in the case of FIG. 4B, the mirror 15 is coupled to a lever 25 via a motion length changing mechanism 26. The lever 25 is pivotally supported by a support member 27 fixed to the mirror box 12, and its one end is driven up and down by a driving mechanism 28.

As the level 25 swings, the mirror 15 swings similar to the case of FIG. 4A, with the help of the motion length changing mechanism 26. Use of the motion length changing mechanism 26 therefore reduces the size of the swinging mechanism.

Figure 4C:
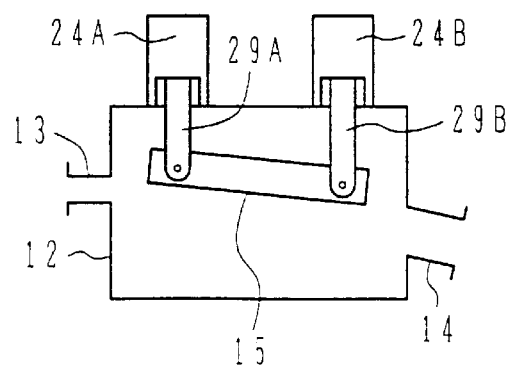

FIG. 4C shows a third example of the swinging mechanism. The mirror 15 is supported via links 29A and 29B by electrical driving mechanisms 24A and 24B which drive the links 29A and 29B up and down. By controlling the phases of up/down motions of the links 29A and 29B and adjusting the amplitudes of the up/down motions properly, the mirror 15 swings similar to the case of FIG. 4A.

Next, the structure of the vacuum duct 30 shown in FIG. 1 near at its output port will be described with reference to FIGS. 5A and 5B.

FIG. 5A is a cross sectional view showing the structure of the vacuum duct 30 near at its output port, and FIG. 5B is a side view as seen along an arrow A shown in FIG. 5A. The vacuum duct 30 is fixed near at its end portion to a base 60 by a support column 32. A flange 33 is formed at the end of the vacuum duct 30 to which one flange 35 of a metal bellows 34 is mounted. Another flange 36 of the bellows 34 is mounted on the window flange 37. As shown in FIG. 5B, the window flange 37 is formed with an opening having a shape defined by curves of upward convex obtained by curving virtual horizontal lines. A beryllium thin film 31 of about 20 μm thickness is welded or soldered to cover the opening. A protective hood 38 extending outward is mounted on the circumference of the opening. This protective hood 38 prevents the beryllium thin film 31 from being broken.

Slide bearings 40 are mounted on right and left extensions of the window flange 37. The slide bearings 40 are fitted around guide shafts 41 so that each bearing 40 slides in a direction guided by the corresponding guide shaft 41. The guide shaft 41 is fixed via opposite bosses 42, support plates 43 and the like, to the vacuum duct 30. The guide direction of the guide shaft is parallel to a cross line between a plane vertical to the center axis of the vacuum duct 30 and a vertical plane including the center axis.

The window flange 37 is coupled to a drive rod 45 of a linear driving unit 46, via an L-shaped metal jig 44 mounted on a lower extension of the window flange 37. The linear driving unit 46 rotates a motor 47 to reciprocally move the drive rod 45 along the guide direction of the guide shaft 41. In response to a reciprocal motion of the drive rod 45, the window flanges 37 moves reciprocally.

The window flange 37 is reciprocally moved synchronously with a swing motion of the optical axis of reflected SR light travelling in the vacuum duct 30. SR light passes through the beryllium thin film 31 and is applied to the exposure plane of the semiconductor substrate 51 shown in FIG. 1.

As shown in FIGS. 3A to 3C, the cross section of reflected SR light has a shape defined by curves of upward convex. Since the beryllium thin film 31 is made to have a shape corresponding to the cross section of SR light, the window area can be made small. Accordingly, ac compared a simple circle shape of the window, the beryllium thin film can be made thick and its breakage can be avoided.

Although the window shape shown in FIG. 5B is defined by curves of upward convex, it may be defined by curves of downward convex if the reflection plane of the mirror 15 shown in FIG. 1 is directed upward and SR light is reflected upward.

In the above, the uniformed energy density, when the swing axis of the mirror 15 shown in FIG. 1 is set on the light source side, has been described. Setting the swing axis on the light source side has the effects of not only uniforming the energy density but also improving a runout. Next, the effects of improving a runout will be described.

While a broad area on the exposure plane is exposed with reflected SR light whose optical axis is swung, if the optical axis of SR light incident upon one point on the exposure area is vertical to the exposure plane, then the optical axis of SR light incident upon another point remote from the one point is oblique to the exposure plane. Since the exposure mask and exposure plane are disposed with a certain gap therebetween, the oblique optical axis makes a mask pattern not correctly transferred to the exposure plane. This phenomenon is called a runout.

In order to alleviate the effects of a runout, it is preferable to set the swing center of reflected SR light as far from the exposure plane as possible. If the swing axis of the mirror 15 shown in FIG. 1 is disposed on the light source side from the exposure plane, it can be understood from approximate calculations that a substantial distance between the swing center of reflected SR light and the exposure plane becomes roughly equal to a sum of the swing radius R and the distance $L_2$ between the reference reflection point $P_{r1}$ and the exposure plane S. Therefore, the swing center of reflected SR light is made remote from the exposure plane and so the effects of a runout can be alleviated.

Converging SR light in the horizontal plane has been described with reference to FIGS. 3A to 3C. Next, converging SR light in the vertical plane will be described. If the mirror 15 shown in FIG. 1 is given some radius of curvature around an axis vertical to the incidence plane of SR light, the SR light can be converged in the vertical plane. Such a mirror can be obtained, for example, by curving a cylindrical mirror along a plane including the center axis of the mirror.

By representing the radius of curvature of the mirror 15 by $r_t$ and an angle θ between the incidence light optical axis and the reflection plane by $(\theta_o - \Delta\theta)$, a focal length $f_t$ with respect to the incidence plane is given by:

$$f_t = (r_t/2) \cdot \sin(\theta_o - \Delta\theta) \quad (7)$$

The conditions that reflected SR light becomes parallel light fluxes satisfy:

$$f_t = L_1 + x \quad (8)$$

By erasing $\Delta\theta$ from the equations (1), (7) and (8), the radius $r_t$ of curvature is expressed as a function of x by:

$$r_t = (2/\sin(\theta_o)) \cdot (x^2/R + (1+L_1/R) \cdot x + L_1) \quad (9)$$

By selecting the radius $r_t$ of curvature to satisfy the equation (9), reflected SR light vertically projected upon the incidence plane becomes parallel light fluxes. Assuming that in FIG. 1 the distance $L_1$ is 3 m, the distance $L_2$ is 6 m, and the angle $\theta_o$ is 1.8°, the radius $r_t$ of curvature is 191 m at the reference position of the mirror 15, i.e., at x=0.

Figure 6A:
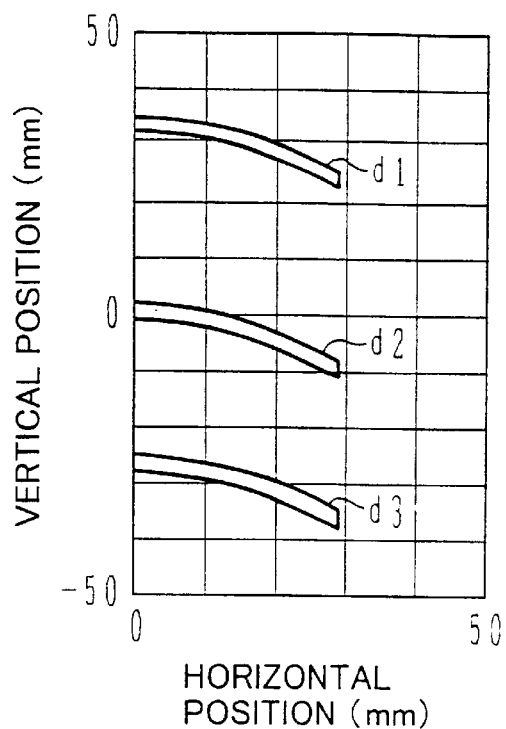
FIGS. 6A and 6B are diagrams showing shapes of SR light radiation areas on an exposure surface.

FIG. 6A shows the shapes of radiation areas on the exposure plane obtained by using a troidal mirror having a radius r of curvature of 188 m in a plane vertical to the incidence plane and a radius $r_t$ of curvature of 191 m in the incidence plane. The abscissa corresponds to the horizontal direction, and the ordinate corresponds to the swing direction of reflected SR light. Shapes $d_1$, $d_2$ and $d_3$ correspond to the radiation areas at the angles θ shown in FIG. 2 of 1.63°, 1.8° and 1.92°, respectively. As compared with the shapes shown in FIGS. 3A to 3C, it is seen that the width in the vertical direction is compressed.

As above, if the width of the radiation area in the vertical direction is compressed, the width of the window 31 of the beryllium thin film shown in FIG. 5B can be made narrower. Therefore, the strength of the beryllium thin film can be increased more and the safety of the system can be improved.

Figure 6B:
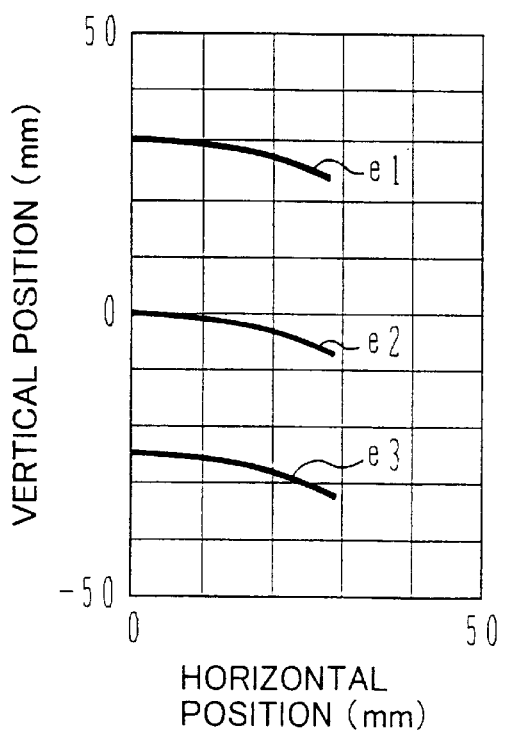

FIG. 6B shows the shapes of radiation areas obtained by using a troidal mirror having a radius $r_t$ of curvature of 127 mm in the incidence plane. Shapes $e_1$, $e_2$ and $e_3$ correspond to the radiation areas at the angles θ shown in FIG. 2 of 1.60°, 1.8° and 1.94°, respectively. With the radius $r_t$ of curvature of 127 m, reflected SR light is focussed on the exposure plane as viewed along the direction perpendicular to the incidence plane. It is seen that the width in the vertical direction is compressed more than the shapes shown in FIG. 6A.

By selecting the radius $r_t$ of curvature to such a value allowing reflected SR light to be focussed on the exposure plane, the area of the window 31 of the beryllium thin film can be reduced. However, as the width of the radiation area in the vertical direction is made narrower, the energy density increases in inverse proportion with it. As the energy density becomes too high, a local temperature rise may occur, thereby increasing a danger during malfunction or other detective operations. Optimum exposure conditions can be set by changing the radius $r_t$ of curvature and the energy density.

As described above, the radius of curvature of the reflection plane in the incidence plane is very large. As a means for forming a mirror with such a large radius of curvature, some method is known in which mirror raw material is placed on a mount having an inversely curved surface and worked to have a proper curvature to thereafter dismount the mirror from the mount. In this case, it is necessary to form a mount having the inversely curved surface. Another method is to give a bending moment to a mirror to form a curved surface.

Figure 7:
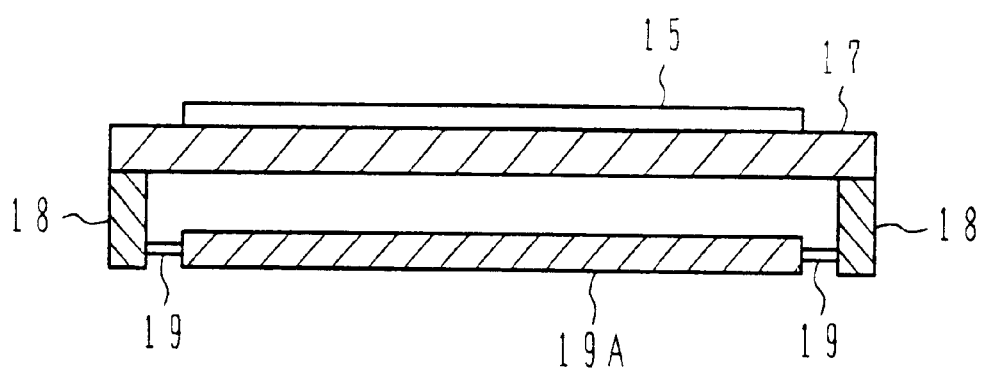
FIG. 7 is a schematic cross sectional view of a mirror support.

FIG. 7 is a schematic cross sectional view of a mirror mount capable of giving a bending moment to a mirror 15. The mirror 15 is placed in tight contact with one side of a mirror mount plate 17. The other side of the mirror mount plate 17 is provided with arms 18 extending vertically from the mirror mount plate, at opposite end portions of the other side. An adjusting screw 19 is inserted into the end portion of each arm 18, and coupled to an expansion rod 19A. The distance between each arm 18 and the end of the expansion rod 19 is adjusted with the adjusting screw to apply a bending moment to the mirror mount plate 17 and curve the mirror 15.

With this method, since a uniform bending moment is generated over the whole length of the mirror mount plate 17, the radius of curvature becomes constant if the mirror mount plate 17 has the same cross sectional area over the whole length thereof. Consider the x-y coordinate system where the direction of a bending moment in the mount plane of the mirror mount plate 17 is the x-axis and the normal direction is the y-direction. The shape of the mount plane of the mirror mount plate 17 is given by a differential equation:

$$d^2y/dx^2 = M/EI_z \quad (10)$$

where M is a bending moment, E is a Young's modulus of the material, and $I_z$ is a cross sectional secondary moment.

Linear equation approximation for the equation (9) produces:

$$r_t = (2/\sin(\theta_o)) \cdot ((1+L_1/R) \cdot x + L_1) \quad (11)$$

Substituting into the equation (11)

$$(2/\sin(\theta_o)) \cdot (1+L_1/R) = a \, (2/\sin(\theta_o)) = b \quad (12)$$

yields:

$$r_t = ax + b \quad (13)$$

The cross sectional shape in the incidence plane of the reflection plane of the mirror 16 is given as a solution of the following differential equation:

$$d^2y/dx^2 = 1/r_t = 1/(ax+b) \quad (14)$$

Comparison between the equations (10) and (14) introduces:

$$I_z = (M/E) \cdot (ax+b) \quad (15)$$

If the elastic secondary moment $I_z$ of the mirror mount plate 17 satisfies the equation (14), a desired radius of curvature is obtained.

If the thickness of the mirror mount plate 17 is constant, the elastic secondary moment $I_d$ is proportional to the width of the mirror mount plate 17. Namely, a desired radius of curvature can be obtained by changing the width of the mirror mount plate 17 in correspondence with (ax+b) in the x-axis direction.

Another embodiment of the invention will be described next.

Figure 8A:
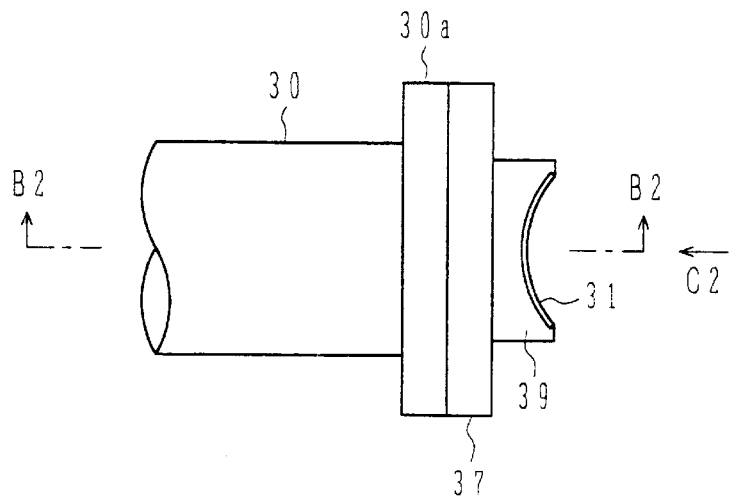
FIGS. 8A to 8C are a plan view, a cross sectional view and a side view of the SR light output port of the X-ray exposure system shown in FIG. 1.
Figure 8B:
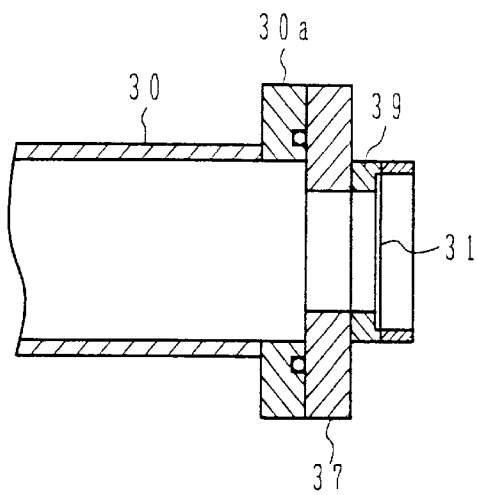
Figure 8C:
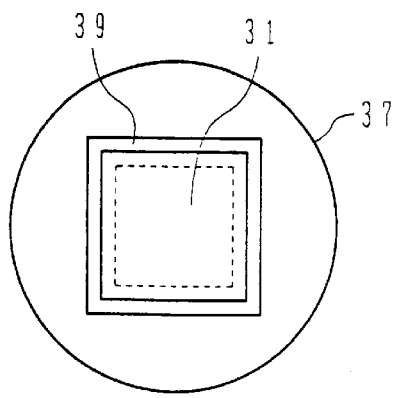

FIG. 8A is a plan view of the outgoing vacuum duct shown in FIG. 1 near at its output port, FIG. 8B is a cross sectional view taken along one-dot chain line B2—B2 shown in FIG. 8A, and FIG. 8C is a side view as seen along an arrow C2 shown in FIG. 8A.

A flange 30a is mounted on the output port of the vacuum duct 30. A window flange 37 having a square opening is coupled to the flange 30a. A coupling region between the flange 30a and window flange 37 is sealed with an O-ring. A window frame 39 is welded to the output port surface of the window flange 37 to surround the opening.

The output port surface of the window frame 39 is worked to have a cylindrical shape. The center axis of this cylindrical surface is perpendicular to the center axis of the vacuum duct 30 (optical center axis of SR light travelling in the duct) and parallel to the vertical plane. A beryllium thin film 31 is welded or soldered to the cylindrical surface of the window frame 39. The beryllium thin film 31 is worked to have a cylindrical shape in correspondence with the cylindrical surface of the window frame 39. A plane beryllium thin film may be deformed along the cylindrical surface of the window frame 39. The vacuum of the vacuum duct 30 is retained by the beryllium thin film 31.

Next, the function of the cylindrical beryllium thin film 31 will be described with reference to FIGS. 9A and 9B.

Figure 9A:
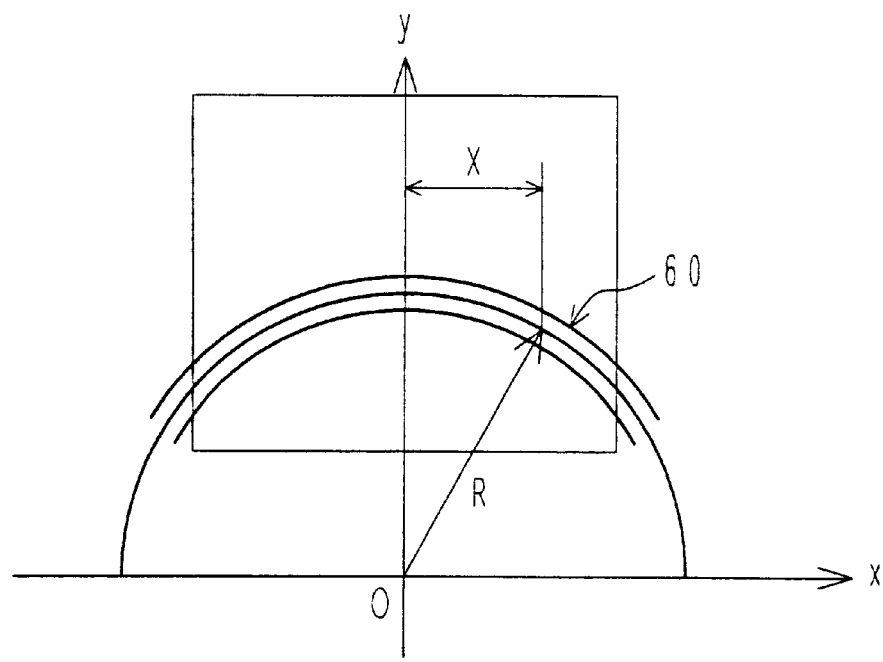
FIG. 9A is a diagram showing the shape of an SR light radiation area on the exposure plane.

FIG. 9A shows a shape of an SR radiation area on the exposure plane of the semiconductor substrate shown in FIG. 1. Consider an x-y coordinate system having as the x-axis the horizontal direction on the exposure plane and as the y-axis the axis perpendicular to both the optical center axis of SR light and the x-axis.

It is assumed that an SR light radiation area 60 (corresponding to a beam cross section of SR light) is defined by a circular line having a radius R. The length of the radiation area 60 cut along a straight line parallel to the y-axis is represented by a function of a coordinate value x. Therefore, a radiation time of a point in the exposure plane when the radiation area 60 is moved at a constant speed along the y-axis direction becomes a function of the coordinate value x. The radiation time of a point at the coordinate value x is proportional to $(1-(x/R)^2)^{-1/2}$.

If the photon density of SR light before it becomes incident upon the beryllium thin film is constant, the exposure amount $P_x$ of the point on the exposure plane assuming that the beryllium thin film does not exist, is given by:

$$P_x = P_o(1-(x/R)^2)^{-1/2} \quad (16)$$

where $P_o$ is an exposure amount of a point on a straight line (y-axis) at x=0.

Figure 9B:
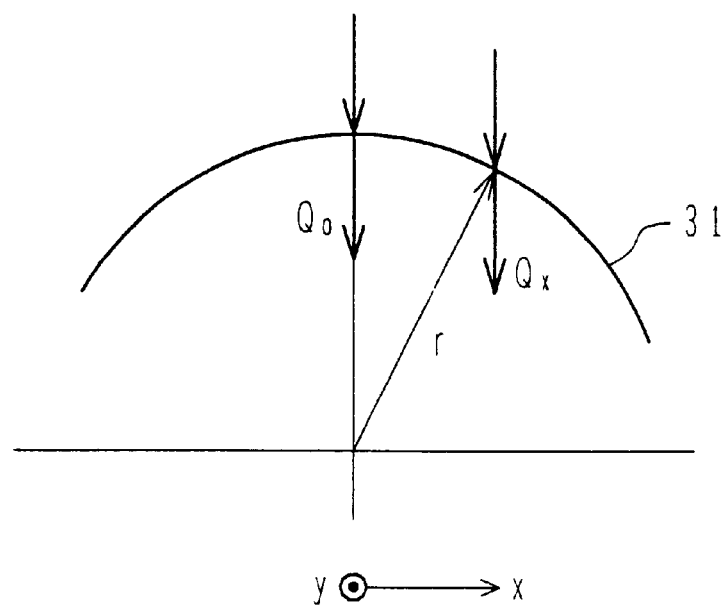
FIG. 9B is a diagram illustrating a relation between a beryllium thin film and an SR light optical axis.

FIG. 9B shows the cross section of the beryllium thin film 31 and the optical axis of SR light, respectively in the plane perpendicular to a generator of the cylindrical surface of the beryllium thin film 31 shown in FIG. 8A. By representing a film thickness of the beryllium thin film 31 by T and a radius of curvature of the cylindrical surface by r, an SR light optical path length $t_x$ of the beryllium thin film 31 at the coordinate value x is given by:

$$t_x = T(1-(x/r)^2)^{-1/2} \quad (17)$$

If an SR light absorption coefficient of the beryllium thin film is $\mu$, the exposure amount $Q_x$ on the exposure surface when SR light transmits through the beryllium thin film is given by:

$$Q_x = P_x \cdot \exp(-\mu t_x) \quad (18)$$

From the equations (16) to (18), the following equation is established:

$$Q_x = P_o(1-(x/R)^2)^{-1/2} \cdot \exp(-\mu T(1-(x/r)^2)^{-1/2}) \quad (19)$$

Since $$Q_o = P_o \cdot \exp(-\mu T) \quad (20),$$

the following equation is obtained from the equations (19) and (20):

$$Q_x/Q_o = (1-(x/R)^2)^{-1/2} \cdot \exp((-\mu T)((1-(x/r)^2)^{-1/2}-1)) = (1-(x/R)^2)^{-1/2} \cdot \exp((-\mu T)((1-(x/kR)^2)^{-1/2}-1)) \quad (21)$$

where $$r = kR \quad (22)$$

Figure 10A:
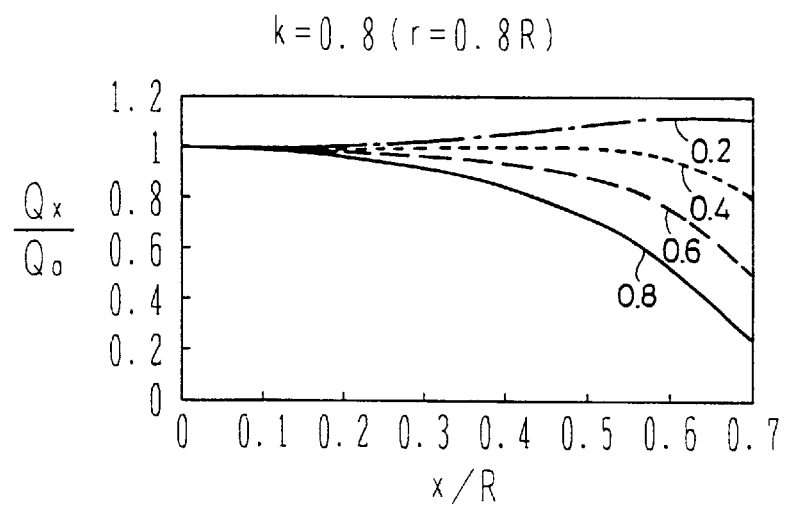
FIGS. 10A to 10C are graphs showing variations of exposure amounts on the exposure plane.
Figure 10B:
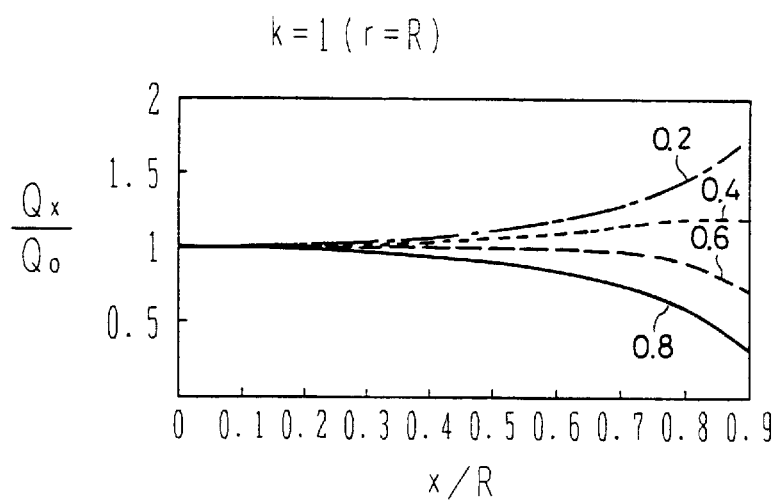
Figure 10C:
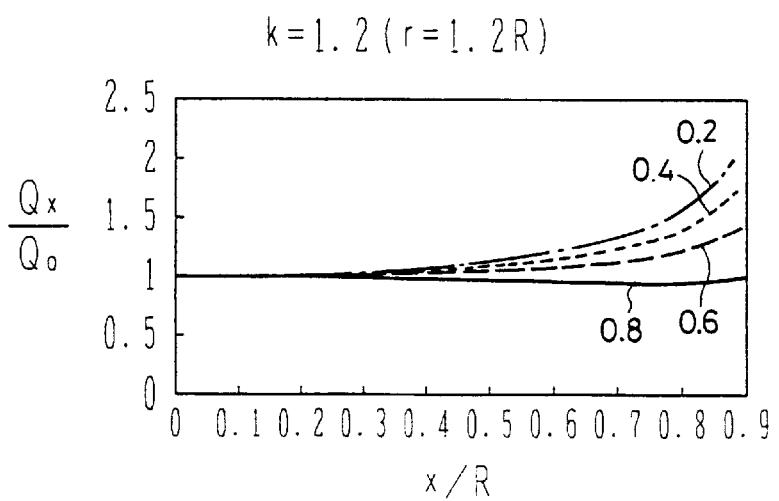

FIGS. 10A to 10C are graphs showing $Q_x/Q_o$ as a function of x/R by using the equation (21). FIGS. 10A to 10C correspond to the values k of 0.8, 1.0 and 1.2, respectively. In the graphs, one-dot chain line, dotted line, broken line and solid line correspond to the value $Q_o/P_o$, i.e., $\exp(-\mu T)$, of 0.2, 0.4, 0.6 and 0.8, respectively.

If $Q_x/Q_o = 1$, the exposure amounts on the exposure plane are uniform. In all the cases shown in FIGS. 10A to 10C, in the area with a small x/R, $Q_x/Q_o$ is near "1", and as the value x/R becomes large, it goes apart from "1". SR light contains different wavelengths in a predetermined range and the transmittivity of a beryllium thin film depends upon the wavelength. $Q_o/P_o$ in average is predicted in the range from 0.4 to 0.6.

If $Q_o/P_o$ is in a range from 0.4 to 0.6, $Q_x/Q_o$ goes lower right at k=0.8, is nearly flat at k=1.0, and goes upper right at K=1.2. It is therefore preferable to set the value k in a range from 0.8 to 1.2, and more preferable to set it near to 1.

In the above studies, it has been assumed that while the SR exposure area is moved on the exposure plane, the shape of the SR exposure area does not change and is defined by circular lines. Even if these assumptions cannot be established strictly, a variation of exposure amounts on the exposure plane can be made small by adjusting the value k. If the shape of an exposure area is defined by curved lines other than circular lines, the beryllium thin film is curved to have a suitable shape matching the shape of the exposure area. In this case, it can be expected that a variation of exposure amounts can be suppressed.

In the example shown in FIG. 8A, the beryllium thin film 31 is curved in convex toward the inside of the vacuum duct 30. Similar effects as above can be expected even if the beryllium thin film 31 is curved in convex toward the outside of the vacuum duct 30. The above structures may be applied not only to the case where the mirror is swung to swing SR light, but also to the case where the semiconductor substrate is moved while the mirror is fixed.

The fundamental teachings of the above embodiment are applicable not only to an X-ray exposure system, but also to other systems where SR light is intended to be attenuated in the plane perpendicular to the optical axis, with some intensity attenuation distribution. If an intensity attenuation in one direction is desired, the thin film is curved along the cylindrical surface formed by a generator perpendicular to the optical axis. Various intensity distributions are possible by changing the curved shape.

The shape of an SR light beam in a plane perpendicular to the optical axis is generally short in a first direction and long in a second direction perpendicular to the first direction. A thin film made of material capable of attenuating SR light may be disposed in the optical path of SR light and, in this case, the thin film is curved in a plane parallel to both the optical axis direction of SR light and the second direction. With such a thin film, SR light can be attenuated by an amount different at different points in the second direction.

In the example shown in FIG. 9A, the cross section of SR light is defined by circular lines having a radius R of curvature. In an actual case, the radiation area 60 of SR light changes its radius R while being moving in the y-axis direction. Although the radiation area 60 is considered as being approximately formed along circular lines, it is considered strictly as being formed along curved lines having no inflection point. It is also considered that the SR light intensity (the number of photons per unit area) in the radiation area 60 is not constant but follows a function of a coordinate value x. Another embodiment capable of making exposure amounts constant by incorporating the above considerations, will be described.

FIG. 11A shows the outline of an X-ray exposure system according to another embodiment. The fundamental structure of the X-ray exposure system shown in FIG. 5 is similar to that shown in FIG. 1. Each constituent element of the X-ray exposure system shown in FIG. 5 is represented by using identical reference numerals to those used in FIG. 1. Only different structures from that of the X-ray exposure system shown in FIG. 1 will be described hereinafter.

The outgoing vacuum duct 30 is coupled via a vacuum bellows 17 to the outgoing opening 14 of the mirror box 12, and supported on a base via a vacuum duct driving mechanism 18. The vacuum duct driving mechanism 18 swings the outgoing vacuum duct 30 so that a relative position of the outgoing vacuum duct 30 and the optical center axis of SR light travelling therein will not change while the optical center axis is swung up and down by a swinging motion of the reflection mirror 15.

A beryllium thin film 31 is adhered to the window flange 37. As shown in FIG. 11B, the window flange 37 is formed with a circular window 37a. The shape of the window 37a has an integrity with that of an SR beam cross section travelling in the outgoing vacuum duct 30. The window 37a is covered with the beryllium thin film 31 whose details will be later given.

Since the relative position of the outgoing vacuum duct 30 and the optical center axis of SR light travelling therein will not change, the SR light always passes through the window 37a and is output to the outside of the outgoing vacuum duct 30 even if the SR light center axis is swung up and down.

An area of the beryllium thin film 31 shown in FIG. 11B is smaller than that shown in FIG. 8C. Therefore, it can easily endure a pressure difference between the outside and inside of the outgoing vacuum duct 30. Furthermore, as will be described in the following, the structure shown in FIG. 11B is advantageous in that a temperature rise of the beryllium thin film 31 is suppressed.

The beryllium thin film 31 plays a roll of a filter for absorbing longer wavelength components of SR light. The energy of SR light absorbed in the beryllium thin film 31 is about 50% of the total energy. Absorption of SR light generates heat in the beryllium thin film 31. This heat is dissipated through thermal conduction to the window flange 37, through radiation from the beryllium thin film and through convection of external air in contact with the beryllium thin film 31.

If the temperature of the beryllium thin film 31 rises to 250° C. or higher, the strength of the film lowers considerably. In order to endure a pressure difference between the inside and outside of the outgoing vacuum duct 30, it is preferable to maintain the temperature of the beryllium thin film 30 not higher than 250° C. In the range of about this temperature, thermal conduction to the window flange 37 becomes dominant for thermal dissipation. As shown in FIG. 11B, since the area of the window 37a is small and elongated, the thermal conduction efficiency can be improved so that a temperature rise of the beryllium thin film 31 can be suppressed.

Next, uniformity of in-plane exposure amounts on the surface of a semiconductor substrate 51 will be discussed.

Figure 12A:
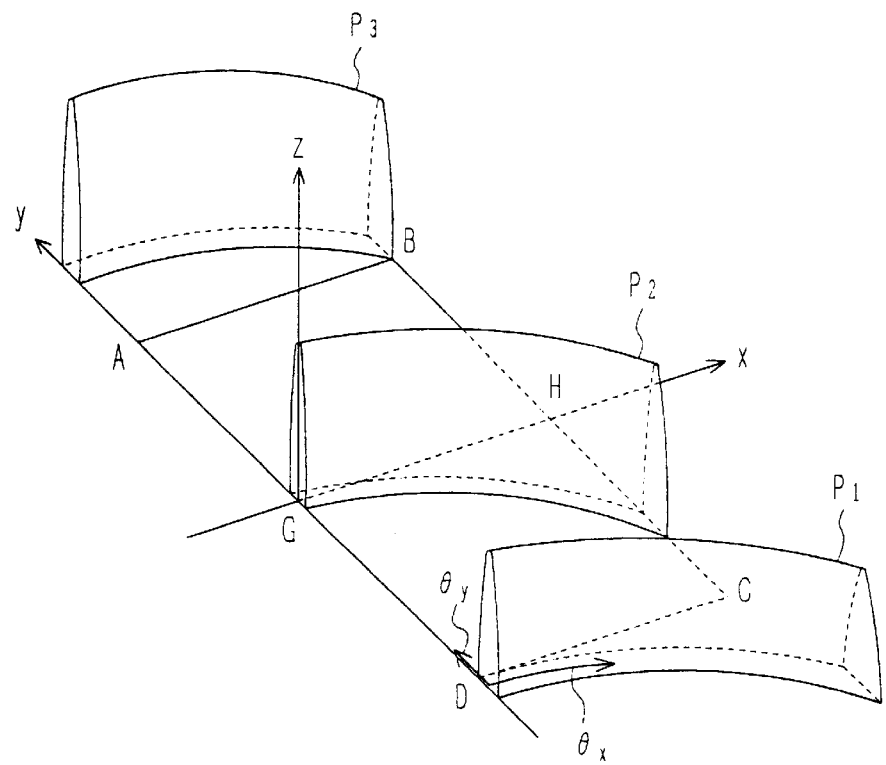
FIG. 12A is a graph showing an intensity distribution of SR light on the exposure plane.

FIG. 12A shows the intensity distribution of SR light applied to the surface of a semiconductor substrate 51. A rectangle ABCD shows a half area of the radiation area, and a straight line AD is a center line of the radiation area. A center of a line segment AD is represented by G and a center of a line segment BC is represented by H. Consider an x-y-z coordinate system on the exposure plane, where the x-axis corresponds to the straight line GH, the y-axis corresponds to a straight line DA, and the z-axis corresponds to a direction normal to the exposure plane. SR light having a beam cross section elongated in the x-axis direction is scanned along the y-axis direction on the exposure plane from a point D toward a point A to thereby expose the rectangle ABCD area.

Assuming that the x-axis direction indicates the intensity of SR light, the intensity distributions of SR light are represented by curved surfaces $P_1$, $P_2$ and $P_3$ respectively at the start of scanning, at the half position of scanning the exposure area, and at the end of scanning. A solid shape defined by each curved surface can be represented by a wall standing in parallel to the x-z plane and slightly curved around a straight line parallel to the z-axis direction. The curvature and height of each wall are determined in accordance with the shape of the reflection mirror 15 shown in FIG. 11, a geometrical layout of SR light and the reflection mirror 15, a thickness of the beryllium thin film 31 and the like. A swing angular velocity of the reflection mirror 15 is assumed to be constant.

Figure 12B:
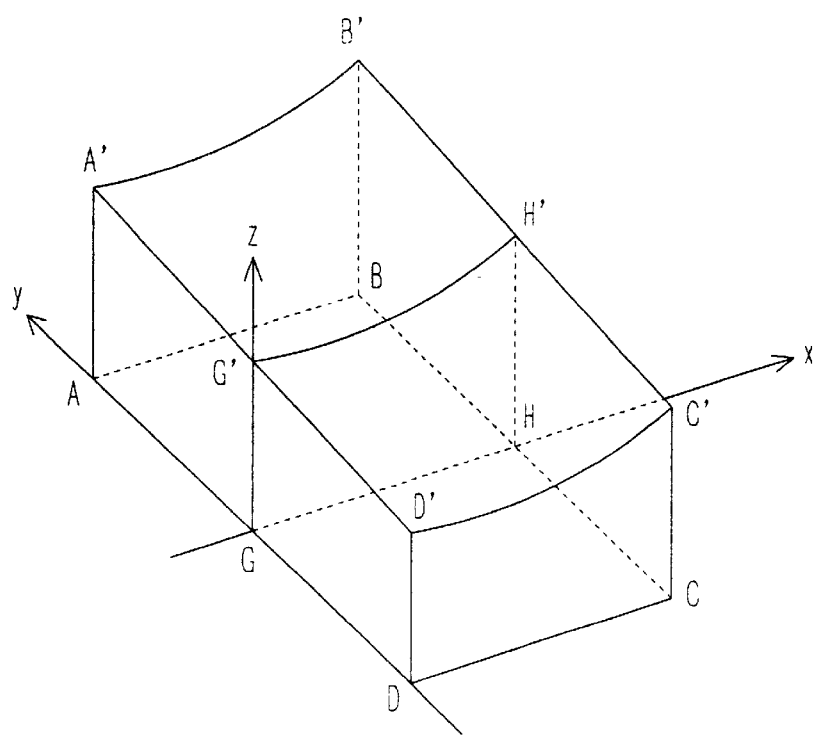
FIG. 12B is a graph showing a distribution of exposure amounts.

FIG. 12B shows a distribution of exposure amounts in the rectangle ABCD when SR light is scanned once on the exposure plane. A height of each point on a curved surface A'B'H'C'D'G' from the x-y plane indicates the exposure amount at that point. For example, the exposure amount at a point A is represented by a length of a line segment AA'.

SR light radiated from the electron circular orbit 3 shown in FIG. 11A spreads greatly in the horizontal direction and slightly in the vertical direction. A contact point of the optical center axis of SR light incident upon the reflection mirror 15 with the electron circular orbit 3 may be considered as a light source of SR light. Using this light source as an origin, an angle of the optical center axis of SR light relative to the horizontal direction is represented by $\theta_x$ and an angle relative to the vertical direction is represented by $\theta_y$. A swing angle of the reflection mirror relative to its reference position is represented by $\phi$. For example, $\phi$ is 0 when the optical center axis of SR light reaches the center point G of the exposure area. As the swing angle $\phi$ changes, an incidence angle of SR light changes and the curved wall representative of the SR light intensity shown in FIG. 12A moves in the y-axis direction. When the swing angle $\phi$ is fixed, e.g., when SR light is applied to the area corresponding to the curved surface $P_1$, the angle $\theta_x$ corresponds to a direction of a curved line of a top edge of the curved line $P_1$ vertically projected upon the x-y plane, whereas the angle $\theta_y$ corresponds to a direction perpendicular to the projected curved line. These angles $\theta_x$ and $\theta_y$ are defined in the same manner also for the curved surfaces $P_2$ and $P_3$. As the swing angle $\phi$ and angles $\theta_x$ and $\theta_y$ are determined, the coordinates (x, y) on the exposure plane and the SR light intensity P at this point can be definitely determined. The values x, y and P can therefore be given by:

$$x = F_x(\theta_x, \theta_y, \phi)$$

$$y = F_y(\theta_x, \theta_y, \phi)$$

$$P = F_P(\theta_x, \theta_y, \phi) \tag{23}$$

Generally, a line intersecting each of the curved surfaces $P_1$ to $P_3$ shown in FIG. 12A and indicating the SR light intensity distribution on the exposure plane at a certain time can be approximated by a Gaussian distribution curve. In order to facilitate the analysis to follow, the curved wall defined by each of the curved surfaces $P_1$ to $P_3$ is assumed as a wall having a rectangular cross section with a uniform thickness at any $\theta_x$, and it is assumed that the area of the rectangular cross section is indicated by an integrated value of Gaussian distribution at the cross section position $\theta_x$. If a thickness of the wall is W and a height thereof is $H(\theta_x, \phi)$, the following equation stands:

$$W \cdot H(\theta_x, \phi) = \int F_P(\theta_x, \theta_y, \phi) d\theta_y \tag{24}$$

Figure 13:
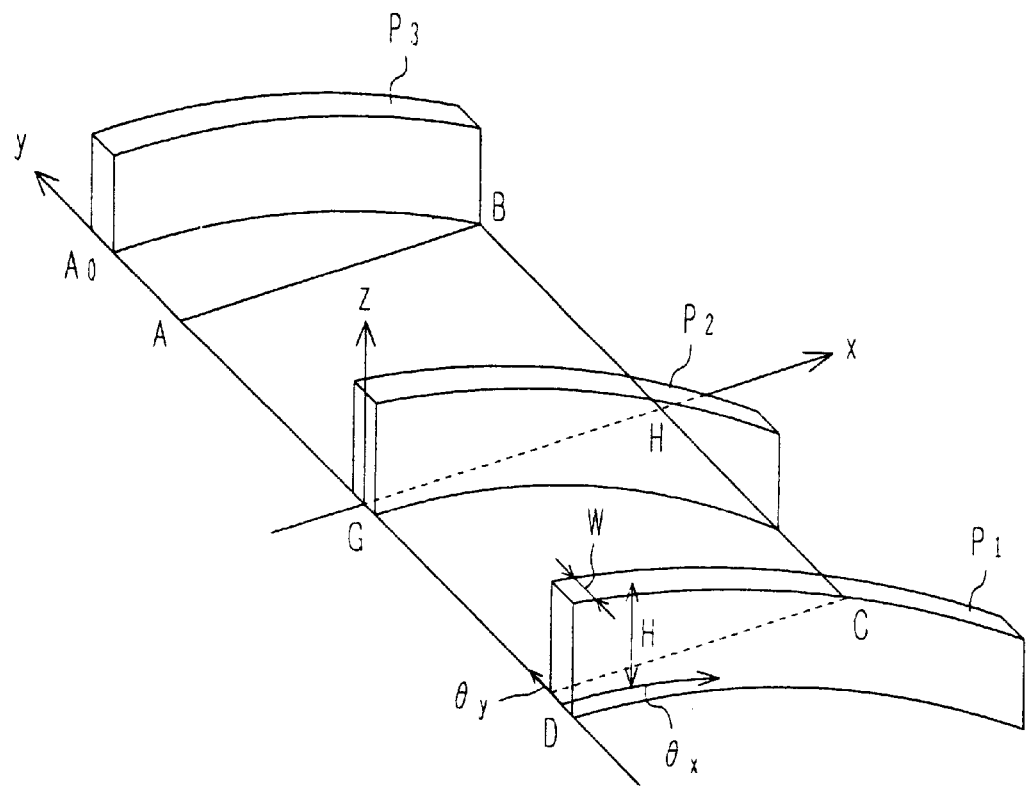
FIG. 13 is a graph showing the cross sections of the intensity distribution shown in FIG. 12A, approximated by quadrilaterals.

FIG. 13 is a graph corresponding to FIG. 12A with the above-described assumptions. The walls defined by the curved surfaces $P_1$ to $P_3$ shown in FIG. 12A are replaced by walls $P_1$ to $P_3$ having a uniform thickness W and a rectangular cross section. In FIG. 13, a center line (line corresponding to $\theta_y=0$) of the wall showing the intensity distribution of SR right is used as a representative of the radiation area of SR light at a certain time. In this case, the intensity of SR light at that time is represented by a function of only x and $\phi$. The intensity P of SR light is therefore given by:

$$P = F_1(x, \phi) \tag{25}$$

An intensity distribution of SR light in the y-axis direction is represented by a function of a swing angle $\phi$.

Figure 14:
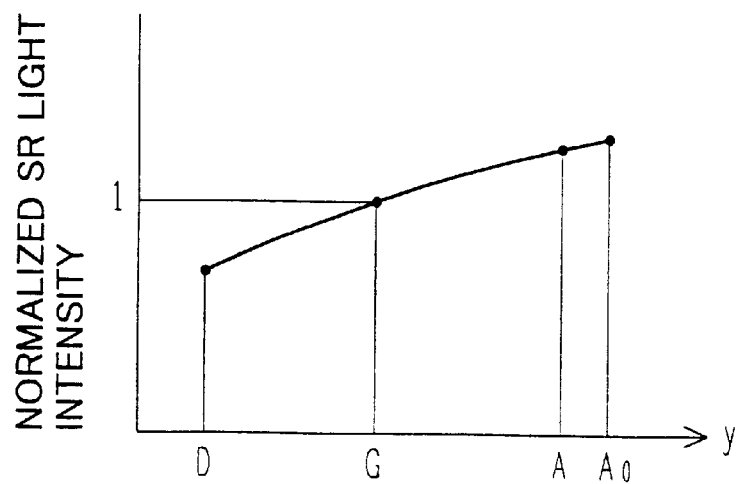
FIG. 14 is a graph showing an SR light intensity distribution shown in FIG. 13 normalized in the y-axis direction.

FIG. 14 is a graph showing an example of a distribution of the SR light intensity in the y-axis direction, as normalized by the intensity at the point G. Even if the SR light intensity in the y-axis direction is not constant, this intensity in the y-axis direction can be made uniform by changing the swing angular velocity of the reflection mirror 15 in accordance with a change in the swing angle $\phi$. This method will be later described.

Figure 15:
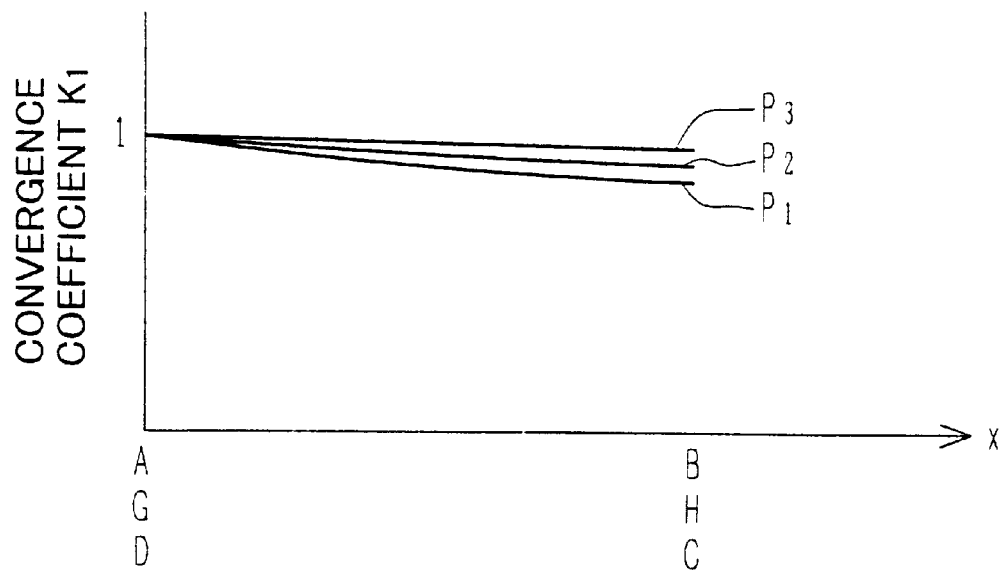
FIG. 15 is a graph showing a distribution of convergence coefficients.

FIG. 15 shows an example of the SR light intensity distribution in the x-axis direction, as normalized by the SR light intensity on the center line AGD of the exposure area. Three curves $P_1$ to $P_3$ shown in FIG. 15 correspond SR light beams applied to the positions of the walls $P_1$ to $P_3$ shown in FIG. 13. FIG. 15 shows a convergence characteristics of the reflection mirror. A convergence coefficient $K_1$ is defined as:

$$K_1(x, \phi) = F_1(x, \phi)/F_1(0, \phi) \tag{26}$$

Figure 16:
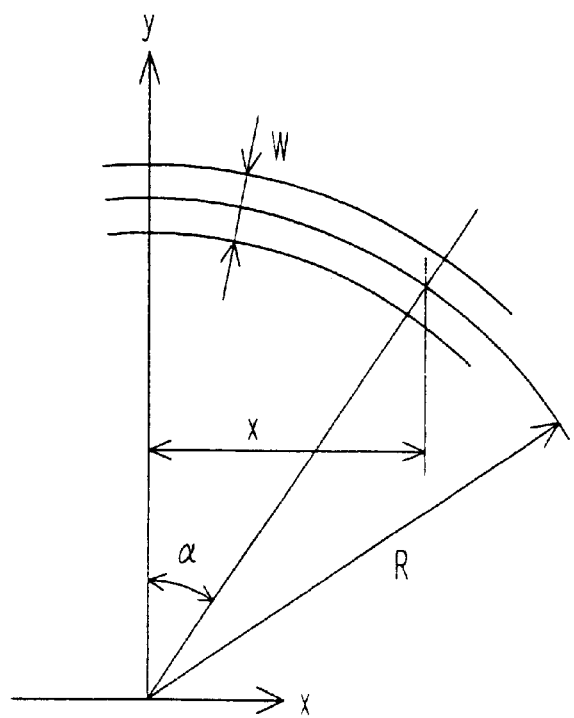
FIG. 16 is a schematic diagram showing the shape of an SR light radiation area.

Referring to FIG. 16, consider the case where SR light is applied to an area having a width W defined along a circular line having a radius R and scanned in the y-axis direction to expose the whole exposure area. A width of a beam in the y-axis direction exposing a point having the coordinate value x in the exposure area is given by:

$$W/\cos(\alpha) \tag{27}$$

Since it is assumed that the width is constant, the exposure amount at the position on a line having a center angle $\alpha$ takes a value of the exposure amount at the position on the center line multiplied by:

$$1/\cos(\alpha) \tag{28}$$

By representing the center line (line corresponding to $\theta_y=0$ shown in FIG. 13) of the beam cross section by a curve $y = g(x, \phi)$, the following equation stands:

$$\tan(\alpha) = dy/dx = (\partial/\partial x) \cdot g(x, \phi) \tag{29}$$

By using the exposure amount on the center line (x=0) of the exposure area as a reference, the exposure amount $K_2(x, \phi)$ at the coordinate value x (hereinafter $K_2$ is called an inclination coefficient) is given by:

$$K_2(x, \phi) = 1/\cos(\alpha) = (1 + ((\partial/\partial x) \cdot g(x, \phi))^2)^{1/2} \tag{30}$$

The rightmost term in the equation (30) is applicable not only to the case where the center line of the beam cross section is defined along a curved line, but also to the general case where it is defined along a smooth curved line without any inflection point.

Figure 17:
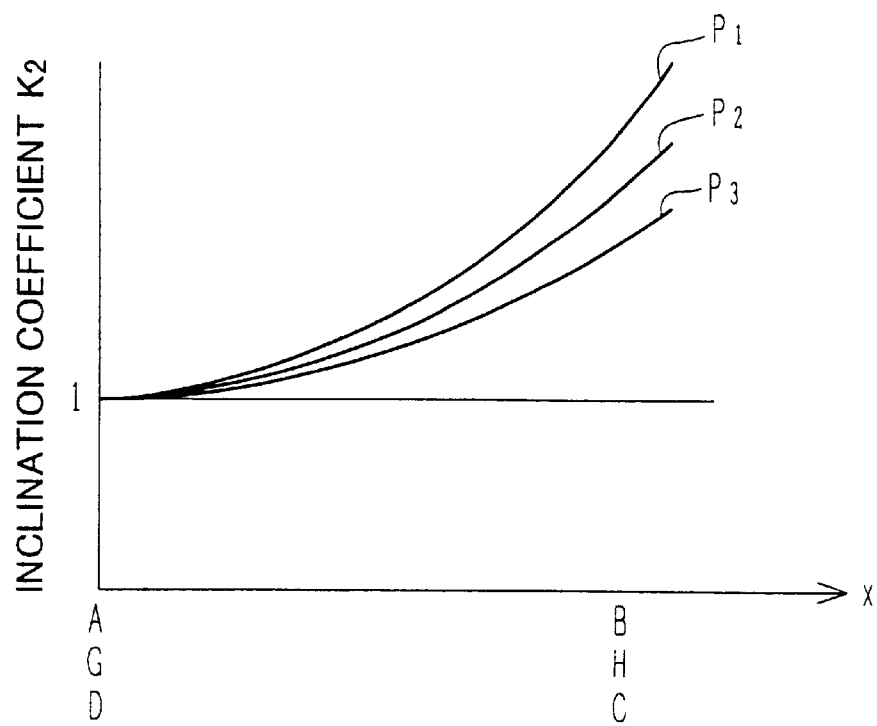
FIG. 17 is a graph showing a distribution of inclination coefficients.

FIG. 17 is a graph showing an example of the equation (30). Three curves $P_1$ to $P_3$ shown in FIG. 17 correspond SR light beams applied to the positions of the walls $P_1$ to $P_3$ shown in FIG. 13.

Figure 18:
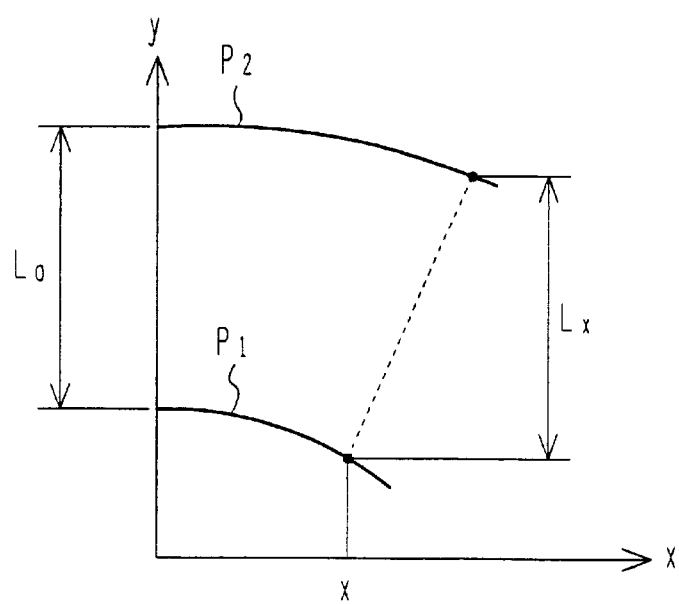
FIG. 18 is a schematic diagram illustrating a change in the shape of an SR light radiation area.

FIG. 18 shows an example of the cross section of an SR light beam to be applied to the exposure plane. Now consider that the radiation position of SR light moves from $P_1$ to $P_2$. As the radiation position moves along the y-axis direction, the curvature of the beam cross section changes. Therefore, the motion amount $L_o$ of a radiation position on the center line (x=0) of the radiation area is different from the motion amount $L_x$ at the coordinate value x. This means that the motion speed of the radiation point changes depending upon the coordinate value x. This variation of the motion speed is required to be considered when the exposure amount on the exposure plane is calculated. A minute change $dy_o$ of the radiation position motion amount on the center line (x=0) of the exposure area, as the swing angle $\phi$ changes finely by $d\phi$, is given from the equation (23) by:

$$dy_o = ((\partial/\partial \phi) \cdot F_y(0, 0, \phi) \cdot d\phi \tag{31}$$

A minute change $dy_x$ at the coordinate value x is given by:

$$dy_x = ((d/d\phi) \cdot F_y(\theta_x, 0, \phi) \cdot d\phi \tag{32}$$

A deformation coefficient $K_3(x, \phi)$ is defined by:

$$K_3(x, \phi) = dy_x/dy_o \quad (33)$$

From the equations (31) to (33), the following equation is derived:

$$K_3(x, \phi) = (\partial/\partial\phi) \cdot F_y(\theta_x, 0, \phi)/(d/d\phi) \cdot F_y(0, 0, \phi) \quad (34)$$

Figure 19:
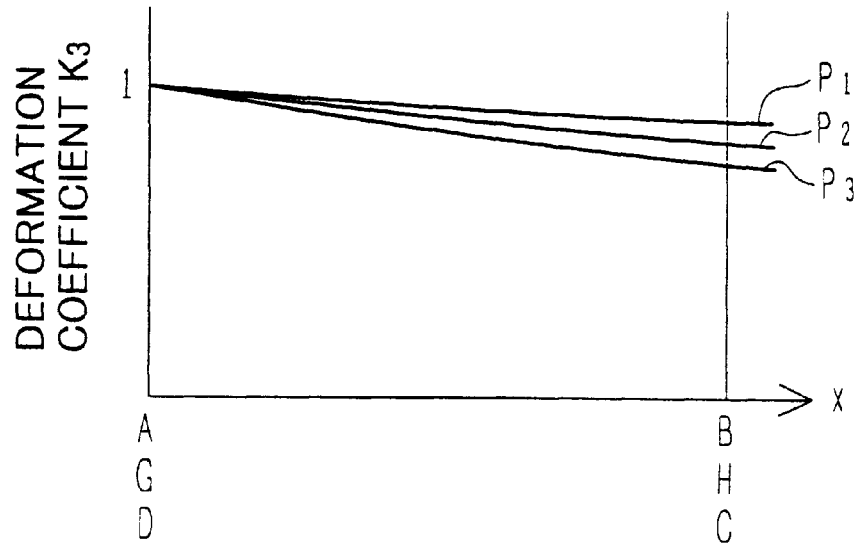
FIG. 19 is a graph showing a distribution of deformation coefficients.

FIG. 19 is a graph showing an example of the deformation coefficient given by the equation (34). Three curves $P_1$ to $P_3$ shown in FIG. 19 correspond SR light beams applied to the positions of the walls $P_1$ to $P_3$ shown in FIG. 13.

From the above studies, it can be understood that the distribution characteristics of exposure amounts in the x-axis direction on the exposure plane are represented by a product of the convergence coefficient $K_1$ illustratively shown in FIG. 15, inclination coefficient $K_2$ illustratively shown in FIG. 17, and deformation coefficient $K_3$ illustratively shown in FIG. 19. This product is defined as a distribution coefficient $K_d(x, \phi)$ which is:

$$K_d(x, \phi) = K_1(x, \phi) \cdot K_2(x, \phi) \cdot K_3(x, \phi) \quad (35)$$

Figure 20:
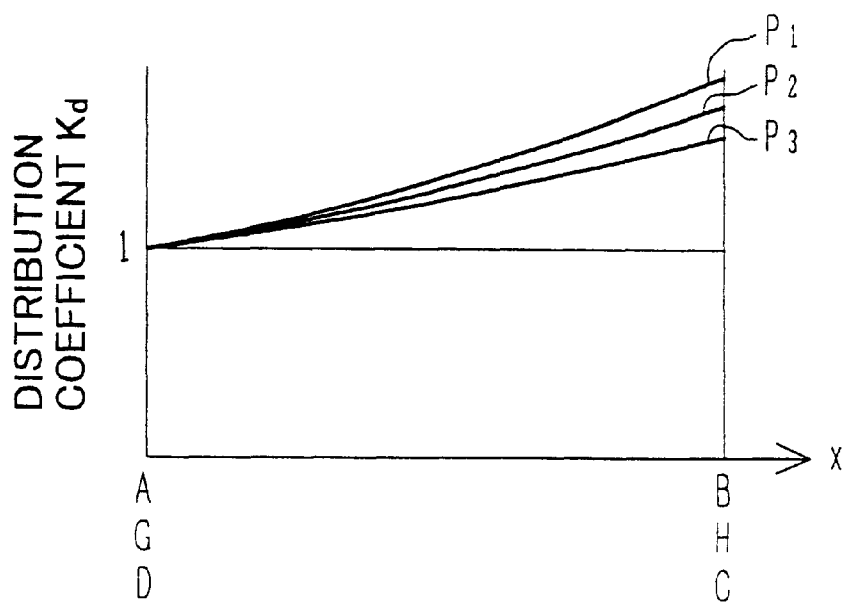
FIG. 20 is a graph showing a distribution of distribution coefficients.

FIG. 20 is a graph showing an example of the distribution coefficient $k_d(x, \phi)$. Three curves $P_1$ to $P_3$ shown in FIG. 19 correspond SR light beams applied to the positions of the walls $P_1$ to $P_3$ shown in FIG. 13. If a $\phi$ dependency of the distribution coefficient $K_d(x, \phi)$ is small, i.e., if the three curves $P_1$ to $P_3$ are not separated greatly, it can be expected that the exposure amount can be made nearly uniform by adjusting the attenuation amount of SR light in the beryllium thin film shown in FIG. 11A in the x-axis direction.

A representative one of various distribution coefficients $K_d$ shown in FIG. 20 obtained when the swing angle $\phi$ is changed, is represented by $F_d(x)$. For example, $K_d(x, \phi)$ when the optical center axis of SR light is positioned at the middle point (point G) in FIG. 12A on the center line (x=0) of the exposure area, is represented by $F_d(x)$.

$$F_d(x) = K_d(x, 0) \quad (36)$$

The number N of photons passed through the beryllium thin film is given by:

$$N = N_o \cdot \exp(-\mu t) \quad (37)$$

wherein $N_o$ is the number of photons of SR light before it enters the beryllium thin film, $\mu$ is a line absorption coefficient which changes depending upon the photon energy (wavelength), and t is an optical path length of SR light in the beryllium thin film. The energy spectrum of SR light changes with a layout of the optical system. Therefore, in calculating the intensity of SR light transmitted through the beryllium thin film, it is necessary to integrate the equation (37) over the whole range of energy spectra. It is assumed herein from a more macro viewpoint that the intensity P of SR light transmitted through the beryllium thin film is represented by the form like the equation (37), namely by:

$$P = P_o \cdot \exp(-\mu_o t) \quad (38)$$

where $P_o$ is the intensity of SR light before it transmits through the beryllium thin film, and $\mu_o$ is a line absorption coefficient (constant). A thickness of the beryllium thin film is represented by T and an incidence angle of SR light upon the beryllium thin film is represented by $\theta$. The angle $\theta$ is an angle between the optical axis of SR light and a normal to the beryllium thin film at the incidence point. In this case, a transmission thickness t of SR light at the incidence point is given by:

$$t = T/\cos(\theta) \quad (39)$$

In order to make the distribution coefficient $K_d$ realize the attenuation effects of the beryllium thin film, the following equation is to be satisfied:

$$(P_o \cdot \exp(-\mu_o T))/(P_o \cdot \exp(-\mu_o T/\cos(\theta))) = F_d(x) \quad (40)$$

By arranging this equation (4), the following equation is obtained:

$$1/\cos(\theta) = 1 + 1/(\mu_o T) \cdot \ln(F_d(x)) \quad (41)$$

By using the beryllium thin film having a shape satisfying the equation (41), irregularity of the exposure amount on the exposure plane in the x-axis direction (horizontal direction) can be relaxed.

Figure 21:
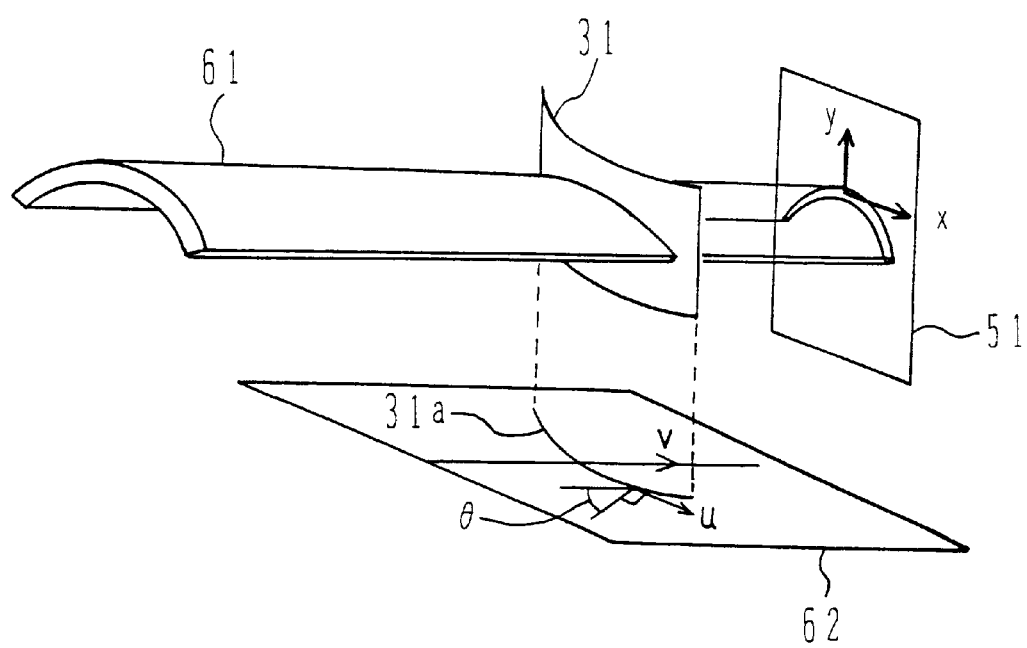
FIG. 21 is a schematic perspective view illustrating an example of the shape of a beryllium thin film.

FIG. 21 shows an example of the beryllium thin film having a shape satisfying the equation (41). SR light 61 having a curved beam cross section transmits through a beryllium thin film 31 and irradiates upon the exposure surface of a semiconductor substrate 51. SR light 61 is in plane symmetry with the vertical plane including the optical center axis of SR light. Consider a virtual plane 62 parallel to the optical center axis of SR light 62 and to the horizontal line vertical to the optical center axis. A u-v rectangular coordinate system is defined on the virtual plane 62, the u-axis direction being the horizontal direction. The beryllium thin film 31 is disposed along a cylindrical surface with the normal direction to the virtual plane 62 as its generator. If the shape of an image 31a of the beryllium thin film 31 vertically projected upon the virtual plane 62 is given by:

$$v = F_{Be}(u) \quad (42)$$

then the following equation stands:

$$\tan(\theta) = dF_{Be}(u)/du \quad (43)$$

Since the u-axis on the virtual plane 62 corresponds to the x-axis on the exposure plane, the variable u in the equation (43) can be replaced by the variable x in the equation (41). From the equations (41) and (43), it stands:

$$dF_{Be}(x)/dx = ((1 + 1/(\mu_o T) \cdot \ln(F_d(x)))^2 - 1)^{1/2} \quad (44)$$

By integrating the equation (44), a proper shape of the beryllium thin film 31 can be obtained.

In the above calculations, the equation (38) is used as an approximate equation representative of the intensity of SR light after it transmits through the beryllium thin film. If the following general equation (45) is adopted:

$$P = H(t) \quad (45),$$

the proper shape of the beryllium thin film is represented by:

$$dF_{Be}(x)/dx = (((1/T \cdot H^{-1} \cdot (H(T)/F_d(x)))^2 - 1)^{1/2} \quad (46)$$

where $H^{-1}$ is an inverse function of H.

As described with FIG. 21, if the beryllium thin film 31 is formed having the shape satisfying the equation (44), irregularity of the exposure amount on the exposure plane in the x-axis direction can be relaxed. Next, a method of relaxing irregularity of the exposure amount in the y-axis direction will be described. Irregularity of the intensity of SR light such as shown in FIG. 14 is present in the y-axis direction on the exposure plane. The normalized SR light intensity distribution shown in FIG. 14 is defined as an intensity coefficient $K_4(\phi)$ which is given by:

$$K_4(\phi)=F_1(0, \phi)/F_1(0, 0) \quad (47)$$

Irregularity of the exposure amount on the exposure plane in the y-axis direction is formed by the irregularity of the SR light intensity shown in FIG. 14 as well as by a variation of the motion speed of an area applied with SR light in the y-axis direction. The variation characteristics of the motion speed in the y-axis direction are normalized by the motion speed when the optical center axis of SR light passes the middle point G of the exposure area, and is represented by a scan coefficient $K_5(\phi)$ which is given by:

$$K_5(\phi)=(d/d\phi)(F_y(0, 0, 0))/(d/d\phi)(F_y(0, 0, \phi)) \quad (48)$$

Irregularity of the exposure amount in the y-axis direction can be evaluated from a product of the intensity coefficient $K_4(\phi)$ and scan coefficient $K_5(\phi)$. This product is defined as a speed coefficient $K_s(\phi)$ which is:

$$K_s(\phi)=K_4(\phi) \cdot K_5(\phi) \quad (49)$$

Irregularity of the exposure amount on the exposure plane in the y-axis direction can therefore be relaxed by changing the swing angular velocity of the reflection mirror in accordance with the swing angle $\phi$, i.e., the incidence angle of SR light, so as to compensate for the speed coefficient $K_s(\phi)$.

In the course of above calculations, the SR light radiation area is covered by using the center line of the curved walls $P_1$ to $P_3$ shown in FIG. 7 and the effects of the thickness of each wall are not considered. The equation (3) is an approximate equation. In the course of above studies, the theory has been developed by using the SR light intensity on the center line (x=0) in the exposure area as a reference. From these reasons, even if the reflection mirror 15 is swung so as to compensate for the speed coefficient $K_s(\phi)$, the effects of uniforming the exposure amount may be small at the peripheral area of the exposure area remote from the center line. In order to enhance the effects of uniforming the exposure amount over the whole exposure area, the SR light intensity at the position apart from the center line may be used as a reference.

Specifically, the shape of the beryllium thin film is first determined from the equation (44), and the swing angular velocity of the reflection mirror 15 is determined from the equation (49). An evaluation experiment of the exposure amount distribution is made by using the beryllium thin film having the determined shape and the determined swing angular velocity of the reflection mirror 15. In accordance with this evaluation results, similar evaluation experiments or simulations through calculations are repeated by changing little by little the shape of the beryllium thin film and the swing angular speed of the reflection mirror 15. With this method, a variation of exposure amounts is expected to be reduced further.

In the latter of the embodiments described above, the shape of the beryllium thin film has been studied in order to uniform the SR light intensity distribution in the x-axis direction shown in FIG. 13. The shape of the beryllium thin film may be optimized in order to uniform the SR light intensity distribution in the y-axis direction.

Figure 22A:
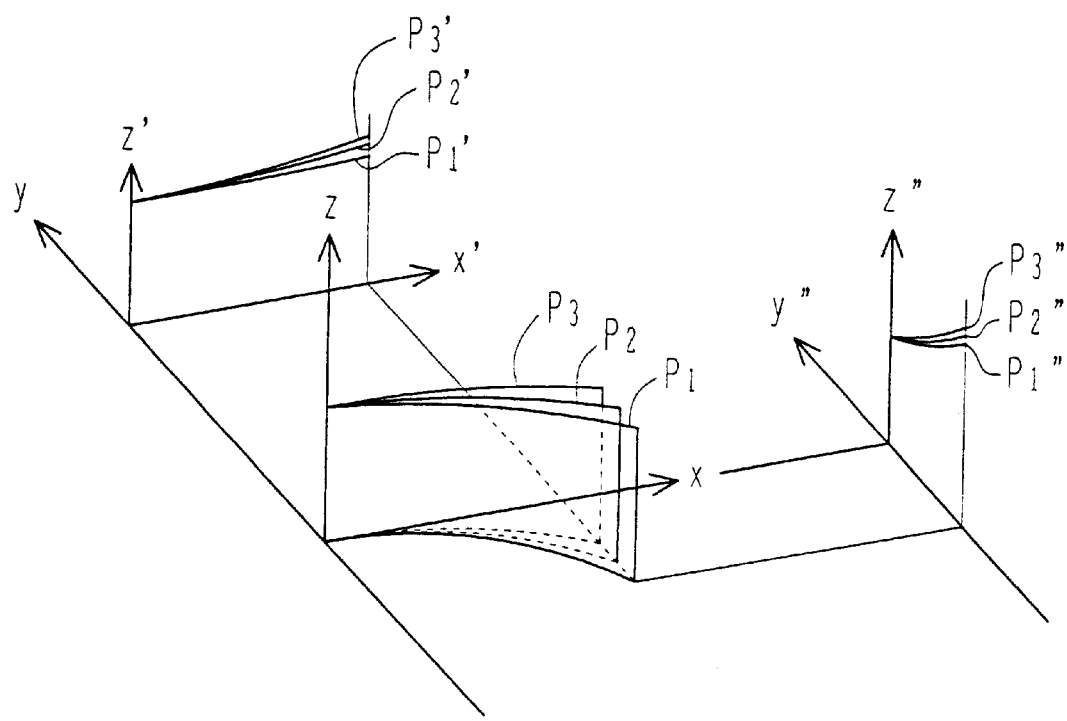
FIG. 22A is a graph showing an SR light intensity distribution.
Figure 22B:
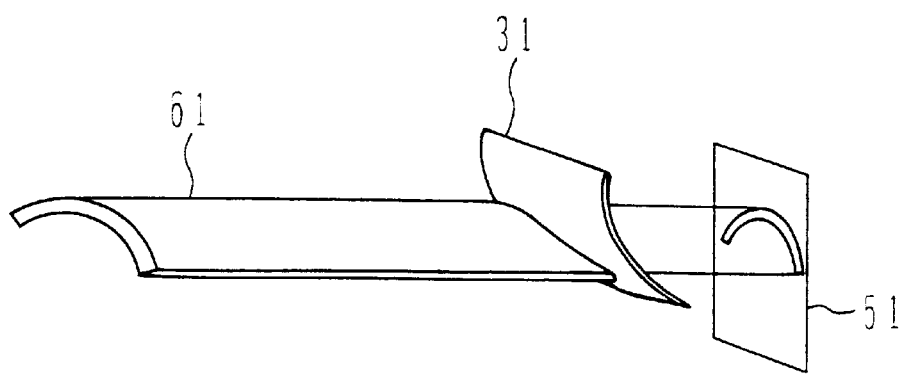
FIG. 22B is a schematic perspective view illustrating an example of the shape of a beryllium thin film.

With reference to FIGS. 22A and 22B, description will be given for a method of optimizing the shape of the beryllium thin film in order to uniform the SR light intensity distribution in the y-axis direction.

FIG. 22A is a graph corresponding to the graph shown in FIG. 13. In this graph, the walls $P_1$ to $P_3$ shown in FIG. 13 are moved in parallel in the y-axis direction to make the positions of the walls $P_1$ to $P_3$ on the y-axis coincide with each other as shown in FIG. 22A. In this graph, the x'-z' coordinate system with the upper edges of the walls $P_1$ to $P_3$ being projected upon the x-z plane corresponds to the graph shown in FIG. 20. The y"-z" coordinate system shows the upper edges of the walls $P_1$ to $P_3$ projected upon the y-z plane.

Also in the y"-z" coordinate system, the SR light intensity is irregular in the y"-axis direction. This irregularity can be relaxed by using an optimum shape of the beryllium thin film which is determined by exchanging the variables x and y used in the above-described studies of uniforming the intensity distribution in the x-axis direction.

FIG. 22B is a diagram corresponding to FIG. 21. In FIG. 21, the generator of the cylindrical surface along the beryllium thin film 31 is perpendicular to the virtual plane 62, whereas in FIG. 22B, the beryllium thin film is disposed along the cylindrical surface having a horizontal generator. Also with the shape of the beryllium thin film 31 shown in FIG. 22B, similar effects described with FIG. 21 can be obtained, i.e., the SR light intensity distribution can be made nearly uniform.

In the case of FIGS. 20 and 21, an optimum shape of the beryllium thin film is determined in accordance with the images of the walls $P_1$ to $P_3$ shown in FIG. 13 vertically projected on the x-z plane, whereas in the case of FIGS. 22A and 22B, an optimum shape of the beryllium thin film is determined in accordance with the images of the walls $P_1$ to $P_3$ vertically projected on the y-z plane. An optimum shape of the beryllium thin film may be determined from other projections.

Figure 23A:
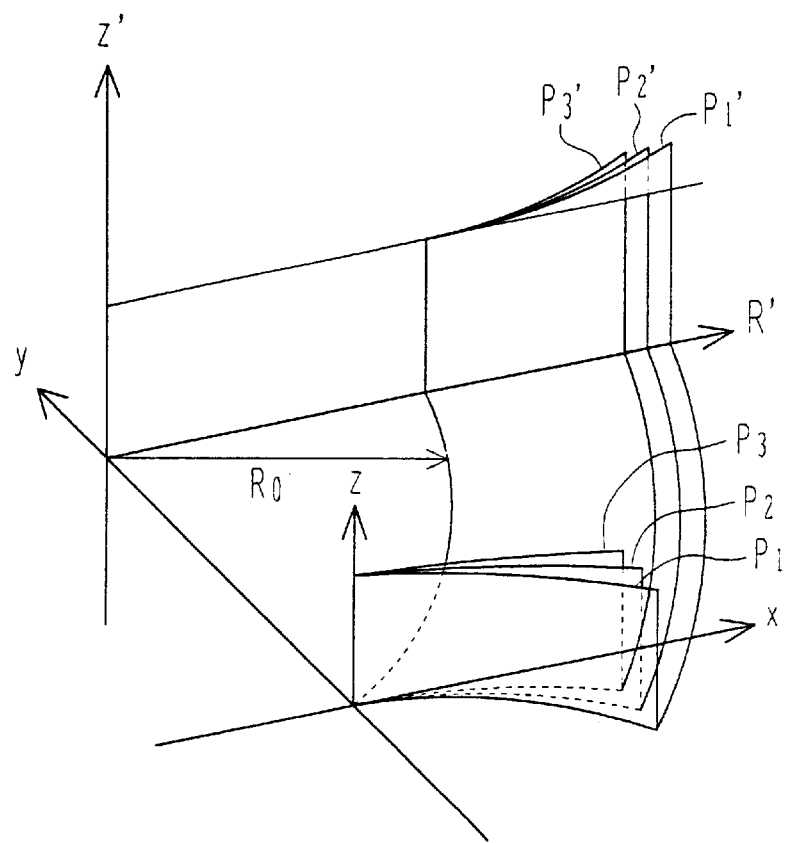
FIG. 23A is a graph showing an SR light intensity distribution.
Figure 23B:
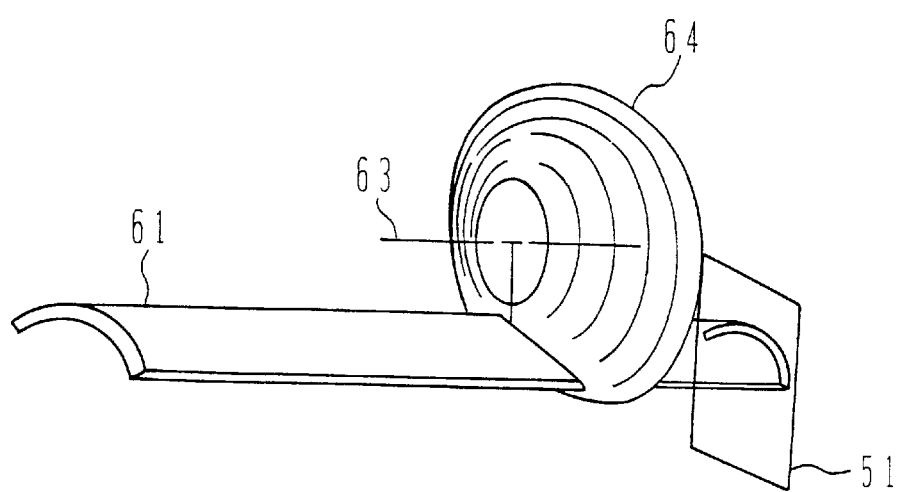
FIG. 23B is a schematic perspective view illustrating an example of the shape of a beryllium thin film.

With reference to FIGS. 23A and 23B, a method of determining an optimum shape of the beryllium thin film from a different projection will be described.

FIG. 23A illustrates a projection and corresponds to FIG. 22A. Supposing a rotary axis z' at the origin $R_o$ of the y-axis and an R'-axis in the x-y plane intersecting the z'-axis, the upper edges of the walls $P_1$ to $P_3$ are rotatively projected around the rotary axis z' upon the z'-R' plane. The shape of the beryllium thin film is optimized by reducing the R' dependency of the rotatively projected images $P_1'$ to $P_3'$.

The position $R_1$ on the R'-axis is represented by using the coordinate values (x, y) in the x-y plane as:

$$R_1=(x^2+(R_o-y)^2)^{1/2} \quad (50)$$

In order to reduce a variation of SR light intensities, the shape of the beryllium thin film is determined by reducing a variation of SR light intensities in accordance with $R_1$.

FIG. 23B shows an example of the shape of the beryllium thin film 31 wherein the optical path length of SR light in the beryllium thin film 31 is changed with $R_1$. A rotary axis 63 is supposed which is in the vertical plane including the optical center axis of SR light and parallel to, and spaced apart by a distance $R_o$ from, the optical center axis. The beryllium thin film is disposed along a rotary surface 64 having the rotary axis 63 as its rotation center. The shape of the rotary surface 64 is determined in such a manner that the R' dependency of the rotatively projected images $P_1'$ to $P_3'$ in the z'-R' plane shown in FIG. 23A is reduced. Also with the shape of the beryllium thin film 31 shown in FIG. 23B, similar effects described with FIG. 21 can be obtained, i.e., the SR light intensity distribution on the exposure plane can be made nearly uniform. If $R_o$ is set to $\infty$ the shape similar to that shown in FIG. 22B is obtained.

Three optimum shapes of the beryllium thin film have been described with reference to FIGS. 21, 22B and 23B. In any of these shapes, the attenuation amount of SR light in the beryllium thin film changes in the in-plane of the film, so that the exposure amount distribution on the exposure plane in the horizontal direction while the reflection mirror 15 is swung, becomes more uniform than the attenuation amount of SR light in the beryllium thin film is not considered.

In the case of FIG. 21, the beryllium thin film has a uniform thickness, and the shape thereof is determined so that a cross line between the beryllium thin film and a plane including both the optical center axis of SR light and a horizontal line perpendicular to the optical center axis, is curved.

In the case of FIG. 22, the shape of the beryllium thin film is determined so that a cross line between the beryllium thin film and a vertical plane including the optical center axis of SR light, is curved.

It is not simple to determine which is optimum among the shapes shown in FIGS. 21, 22B and 23B, as the shape of the beryllium thin film. In order to uniform the SR light intensity over the whole exposure plane, it is sufficient if a variation of distribution coefficients is reduced. The distribution coefficients for the shape shown in FIG. 21 are shown in FIG. 20. The distribution coefficients for the shape shown in FIG. 22B are shown on the y"-z" plane of FIG. 22A. The distribution coefficients for the shape shown in FIG. 23B are shown on the R'-z' plane of FIG. 23A.

Figure 24:
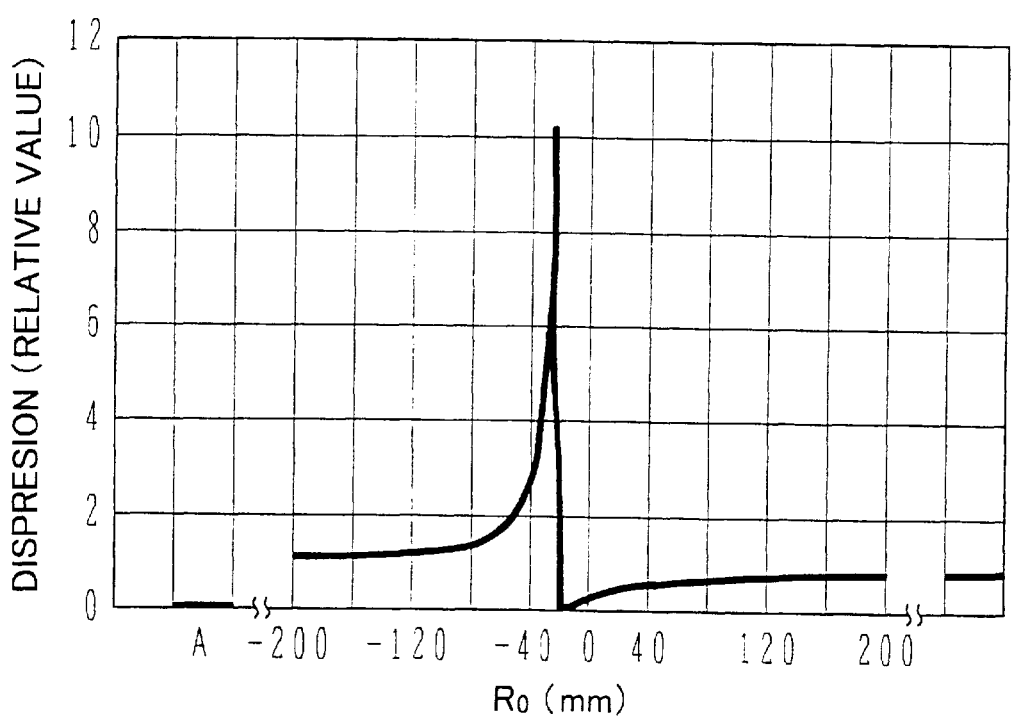
FIG. 24 is a graph showing a dispersion of distribution coefficients.

FIG. 24 is a graph showing the calculation results of dispersion of distribution coefficients which are calculated by obtaining a curve representative of an average of distribution coefficients by using the least square method and by using the average. The abscissa represents $R_o$ shown in FIG. 23A, and the ordinate represents a dispersion of distribution coefficients in a relative value, the value "1" corresponding to $R_o=\infty$. A distance between the light source and the incidence point of the reflection mirror 15 was set to 3 m, a distance between the reflection mirror 15 and the exposure plane was set to 2 m, the reflection mirror 15 had a main radius of 110 mm and a subsidiary radius of 286 m, and an incidence angle was set to 88.8°.

It is seen that as $R_o$ is changed, the dispersion of distribution coefficients becomes large. $R_o=\infty$ or $-\infty$ corresponds to the case of FIG. 22B. As $R_o$ takes near the radius of curvature of the beam cross section of SR light, dispersion changes to divergence. The beryllium thin film has preferably the shape which reduces dispersion of distribution coefficients. However, if the degree of curvature of the beryllium thin film becomes large, the exposure amount distribution is easily affected by the SR light beam width (corresponding to the thickness W of each wall $P_1$ to $P_3$ shown in FIG. 13).

With a saucer type curved surface of the beryllium thin film such as shown in FIG. 23B, a variation of thicknesses or the like is likely to occur during drawing work of forming the film. Whether which shape among those shown in FIGS. 21, 22B and 23B is adopted is preferably determined synthetically by considering dispersion, work ease, and the like.

In the above embodiments, a beryllium thin film having a uniform thickness is curved or another type of a beryllium thin film is used to provide an SR light attenuation distribution. A thickness distribution of a beryllium thin film may be used to optimize a transmission optical path length of SR light.

Figure 25:
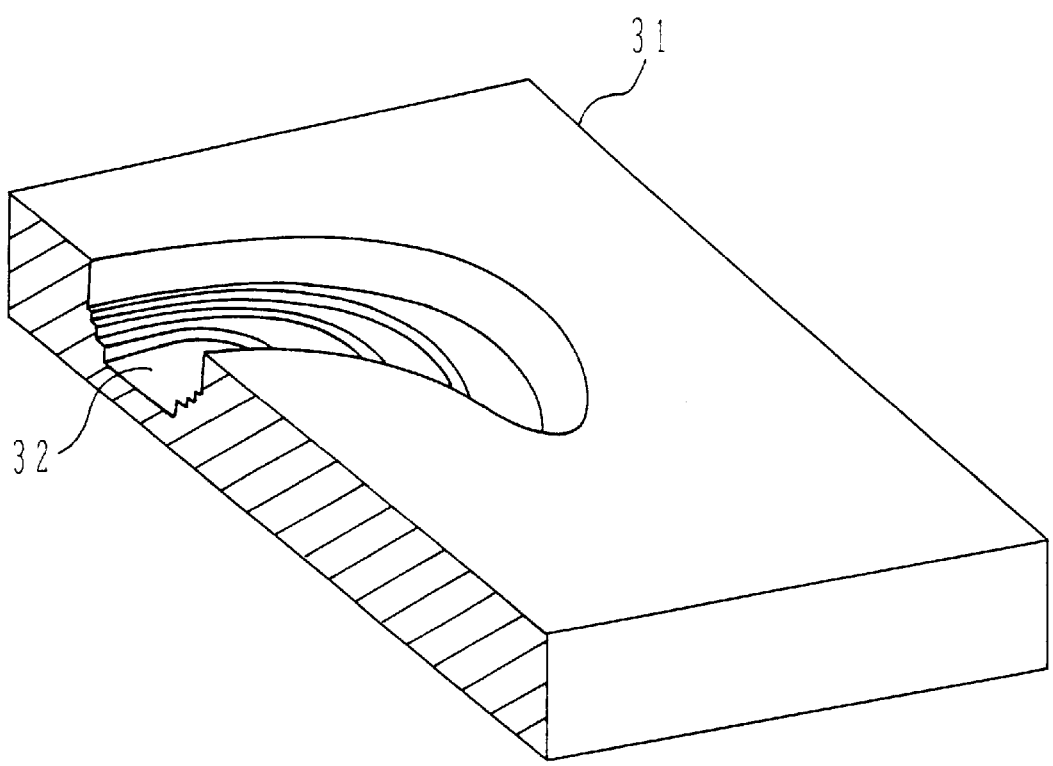
FIG. 25 is a partially broken perspective view showing an example of the structure of a beryllium thin film.

FIG. 25 is a partially broken perspective view showing an example of a beryllium thin film having a thickness distribution. A thin portion 32 corresponding to the SR light beam cross section is formed in the beryllium thin film in the area through which SR light transmits. The thickness of the thin portion 32 is set so that a change in the distribution coefficients shown in FIG. 20 is compensated.

The beryllium thin film can be formed by a generally precise cutting work. Discharge work, electrolytic polishing or the like may also be used. Since the contact surface to the window flange 37 is plane, vacuum sealing can be performed with ease by using an O-ring or the like.

The thin portion 32 shown in FIG. 25 is made stepwise so as to grasp the shape thereof easily from this drawing. The surface of the thin portion 32 may be worked to have a smooth three-dimensional curved surface.

In the embodiment shown in FIGS. 11A to 25, the outgoing vacuum duct 30 is swung so as not to change the relative position between the optical center axis of SR light and the beryllium thin film 31. In this case, the optical center axis of SR light always passes a particular point of the beryllium thin film.

Figure 26A:
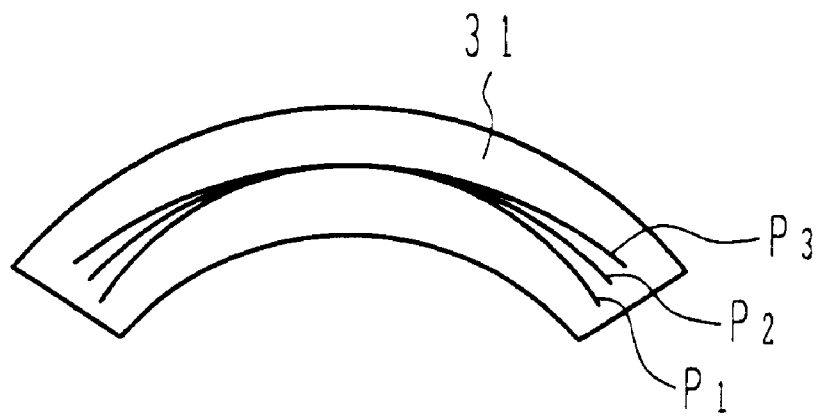
FIGS. 26A and 26B are schematic diagrams illustrating a way an SR light radiation area moves in the in-plane of a beryllium thin film.

FIG. 26A shows the transmission area of SR light in the in-plane of the beryllium thin film 31 without a change in the relative position between the optical center axis of SR light and the beryllium thin film 31. Three curves $P_1$ to $P_3$ correspond SR light beams applied to the positions of the walls $P_1$ to $P_3$ shown in FIG. 12A.

If the amplitude of an up/down swing of the optical center axis of SR light is made different from the amplitude of a motion of the beryllium thin film, a transmission position of SR light in the in-plane of the beryllium thin film changes.

Figure 26B:
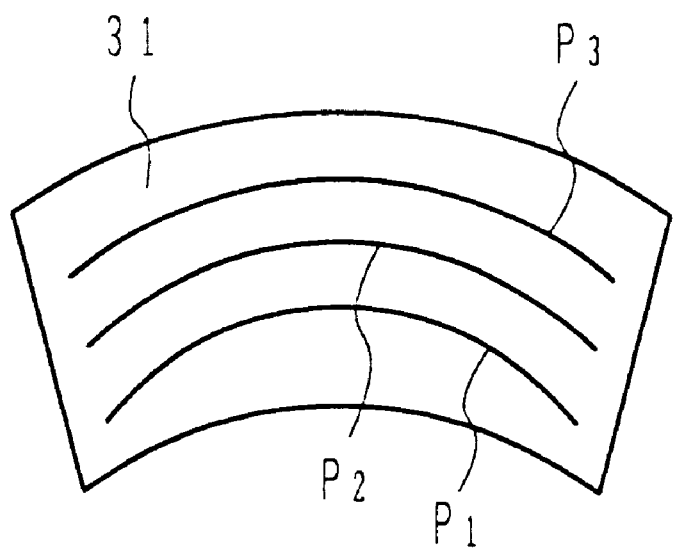

FIG. 26B shows changes in the transmission positions of SR light. Three curves $P_1$ to $P_3$ correspond SR light beams applied to the positions of the walls $P_1$ to $P_3$ shown in FIG. 12A. If the beryllium thin film is provided with a thickness distribution corresponding to the positions of the curves $P_1$ to $P_3$, a change in the speed coefficient $K_s$ given by the equation (49) can be compensated.

Figure 27:
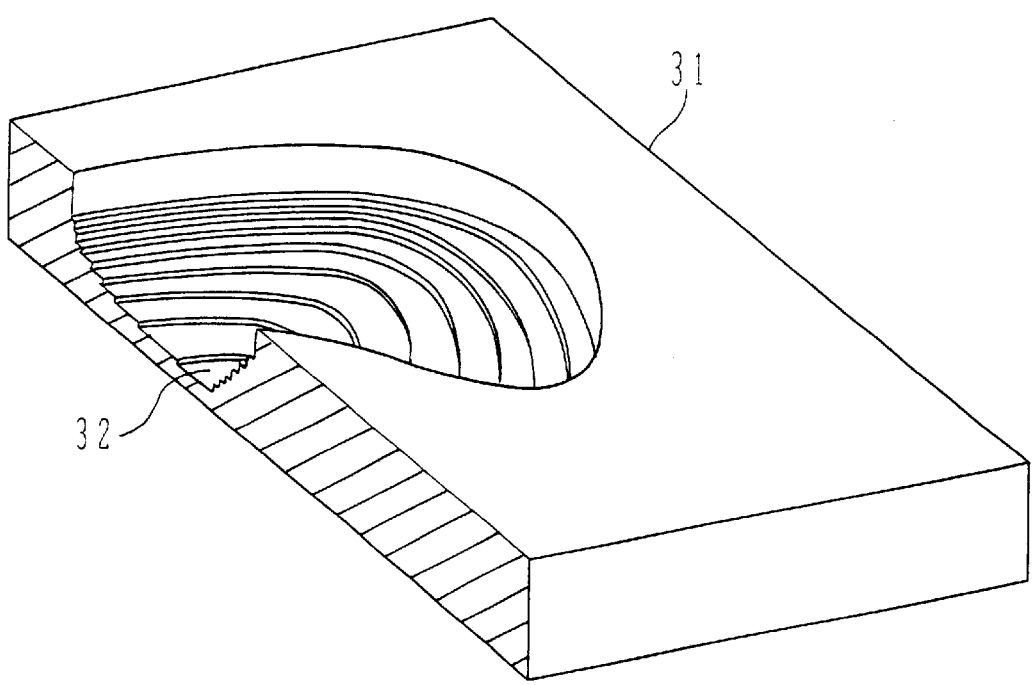
FIG. 27 is a partially broken perspective view showing an example of the structure of a beryllium thin film.

FIG. 27 is a partially broken perspective view showing an example of a beryllium thin film capable of compensating a change in the speed coefficient $K_s$. As compared to FIG. 25, the thin portion 32 of this example expands in the swing direction of SR light. The area through which SR light transmits moves in this thin portion 32 in response to the swing of the reflection mirror 15. The thin portion 32 is provided with the thickness distribution capable of compensating for a change in the speed coefficient $K_s$ as the reflection mirror 15 swings.

In the embodiment shown in FIGS. 11A to 25, the swing angular velocity of the reflection mirror 15 is changed with the swing angle $\phi$ to compensate for a change in the speed coefficient $K_s$. If the beryllium thin film is formed to have the shape shown in FIG. 27, a change in the speed coefficient $K_s$ can be compensated while the swing angular velocity of the reflection mirror 15 is maintained constant. In this case, the structure of the mirror swinging mechanism 16 can be simplified.

The present invention has been described in connection with the preferred embodiments. The invention is not limited only to the above embodiments. It is apparent that various modifications, improvements, combinations, and the like can be made by those skilled in the art.

What is claimed is:

1. A synchrotron radiation light transmission system, comprising:
   a synchrotron radiating a synchrotron radiation light whose beam cross section is shorter in a vertical direction than in a horizontal direction; and
   a thin film disposed in a path of the synchrotron radiation light for attenuating and transmitting the synchrotron radiation light therethrough, wherein an optical path length in said thin film is made different in each point in an in-plane of said thin film to change an attenuation amount of the synchrotron radiation light in the horizontal direction.

2. A synchrotron radiation light transmission system, according to claim 1, further comprising:
- a mirror box formed with an incoming opening and an outgoing opening through which the synchrotron radiation light passes;
- a mirror disposed in said mirror box for reflecting the synchrotron radiation light; and
- a duct coupled to the outgoing opening of said mirror box for defining a hollow space through which the synchrotron radiation light output from the outgoing opening passes;
- wherein the thin film is mounted at an output port of said duct.

3. A synchrotron radiation light transmission system, according to claim 1, wherein said thin film has a thickness distribution set to change the optical path length of the synchrotron radiation light in the in-plane.

4. A synchrotron radiation light transmission system, according to claim 1, wherein said thin film is disposed along a cylindrical surface having a horizontal generator.

5. A synchrotron radiation light transmission system, according to claim 2, wherein said thin film is formed so that the optical path length in said thin film of the synchrotron radiation light is made longer as said thin film becomes more distant from an incidence plane of said mirror of an optical center axis df the synchrotron radiation light along a direction perpendicular to the incidence plane.

6. A synchrotron radiation light transmission system comprising:
- a synchrotron radiating a synchrotron radiation light whose beam cross section is shorter in a vertical direction than in a horizontal direction; and
- a thin film disposed in a path of the synchrotron radiation light for attenuating and transmitting the synchrotron radiation light therethrough, said thin film being disposed along a cylindrical surface whose generator is normal to a virtual plane parallel to an optical center axis of the synchrotron radiation light and to a horizontal line perpendicular to the optical center axis of the synchrotron radiation light.

7. A synchrotron radiation light transmission system comprising:
- a synchrotron radiating a synchrotron radiation light whose beam cross section is shorter in a vertical direction than in a horizontal direction; and
- a thin film disposed in a path of the synchrotron radiation light for attenuating and transmitting the synchrotron radiation light therethrough;
- wherein an optical path length of the synchrotron radiation light in the thin film is changed with a variable $R_1$, the variable $R_1$ being a distance from a rotary axis which is in a vertical plane including an optical central axis of the synchrotron radiation light, and parallel to, and spaced apart by a distance from, the optical central axis of the synchrotron radiation light.

* * * * *